United States Patent
Oh et al.

(10) Patent No.: US 12,421,029 B2
(45) Date of Patent: Sep. 23, 2025

(54) CRANE AND STOCKER SYSTEM INCLUDING THE SAME

(71) Applicant: SAMSUNG ELECTRONICS CO., LTD., Suwon-si (KR)

(72) Inventors: Youngon Oh, Hwaseong-si (KR); Jihun Kim, Uiwang-si (KR); Sanghyuk Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 440 days.

(21) Appl. No.: 18/064,248

(22) Filed: Dec. 9, 2022

(65) Prior Publication Data
US 2023/0211946 A1 Jul. 6, 2023

(30) Foreign Application Priority Data
Jan. 4, 2022 (KR) .................. 10-2022-0000718

(51) Int. Cl.
*B65G 1/04* (2006.01)

(52) U.S. Cl.
CPC .................. *B65G 1/0407* (2013.01)

(58) Field of Classification Search
CPC .. B66F 9/063; B66F 9/061; B66F 9/07; B66F 9/072; B66F 9/0755; H01L 21/67769; B65G 1/0407; B65G 1/04; B65G 1/0414
See application file for complete search history.

(56) References Cited

U.S. PATENT DOCUMENTS

| | | | |
|---|---|---|---|
| 3,832,937 A * | 9/1974 | Moore | F15B 15/16 91/446 |
| 4,459,078 A * | 7/1984 | Chiantella | B65G 1/0414 414/284 |
| 10,583,983 B2 | 3/2020 | Kawamura et al. | |
| 10,618,732 B2 | 4/2020 | Iwata et al. | |
| 2005/0252429 A1* | 11/2005 | Logan | B60N 3/001 108/147 |
| 2006/0054395 A1* | 3/2006 | Kovacic | B66F 7/0666 182/141 |
| 2007/0071585 A1* | 3/2007 | Henkel | B66F 9/0755 414/471 |

FOREIGN PATENT DOCUMENTS

| | | |
|---|---|---|
| JP | 6811028 | 12/2020 |
| JP | 2021-042036 | 3/2021 |
| KR | 1002962 | 12/2010 |
| KR | 1404026 | 5/2014 |
| KR | 2058438 | 12/2019 |

* cited by examiner

*Primary Examiner* — Glenn F Myers
(74) *Attorney, Agent, or Firm* — Morgan, Lewis & Bockius LLP

(57) ABSTRACT

A stocker system includes a main frame, a plurality of shelves disposed within the main frame, and a crane adjacent to the main frame. The crane includes a lower module that includes a plurality of lower profiles. An upper module is disposed on the lower module. The upper module includes a plurality of upper profiles and at least one upper expandable plate. The plurality of upper profiles is disposed on the plurality of lower profiles. The at least one upper expandable plate is disposed between the plurality of upper profiles.

20 Claims, 28 Drawing Sheets

20

CRANE AND STOCKER SYSTEM INCLUDING THE SAME

CROSS-REFERENCE TO THE RELATED APPLICATION

This non-provisional patent application claims priority under 35 U.S.C. § 119 from Korean Patent Application No. 10-2022-0000718, filed on Jan. 4, 2022 in the Korean Intellectual Property Office, the contents of which are herein incorporated by reference in their entirety.

TECHNICAL FIELD

Exemplary embodiments of the disclosure are directed to a crane, a stocker system including the same, and an installation method thereof.

DISCUSSION OF THE RELATED ART

Various kinds of stocker systems are used in a process of manufacturing a semiconductor device. A stocker system includes a crane and a plurality of shelves for transfer and storage of a material to be transferred. Transport and installation of the crane takes time and may involve risk of a safety incident.

SUMMARY

Exemplary embodiments of the disclosure provide a crane that can reduce installation time and prevent safety incidents, a stocker system including the same, and an installation method thereof.

A stocker system according to exemplary embodiments of the disclosure includes a main frame, a plurality of shelves disposed within the main frame, and a crane adjacent to the main frame. The crane includes a lower module that includes a plurality of lower profiles, and an upper module disposed on the lower module. The upper module includes a plurality of upper profiles disposed on the plurality of lower profiles, and at least one upper expandable plate disposed between the plurality of upper profiles.

A crane according to exemplary embodiments of the disclosure includes a lower module that includes a plurality of lower profiles spaced apart from one another. An upper module is disposed on the lower module. The upper module includes a plurality of upper profiles disposed on the plurality of lower profiles. At least one upper expandable plate is disposed between the plurality of upper profiles.

A crane according to exemplary embodiments of the disclosure includes a lower plate, a lower module disposed on the lower plate while including a plurality of lower profiles spaced apart from one another, a middle module disposed on the lower module, an upper module disposed on the middle module, and an upper plate disposed on the upper module. The middle module includes a plurality of middle profiles disposed on the plurality of lower profiles, and at least one middle expandable plate disposed between the plurality of middle profiles. The upper module includes a plurality of upper profiles disposed on the plurality of middle profiles, and at least one upper expandable plate disposed between the plurality of upper profiles.

DETAILED DESCRIPTION

Figure 1:
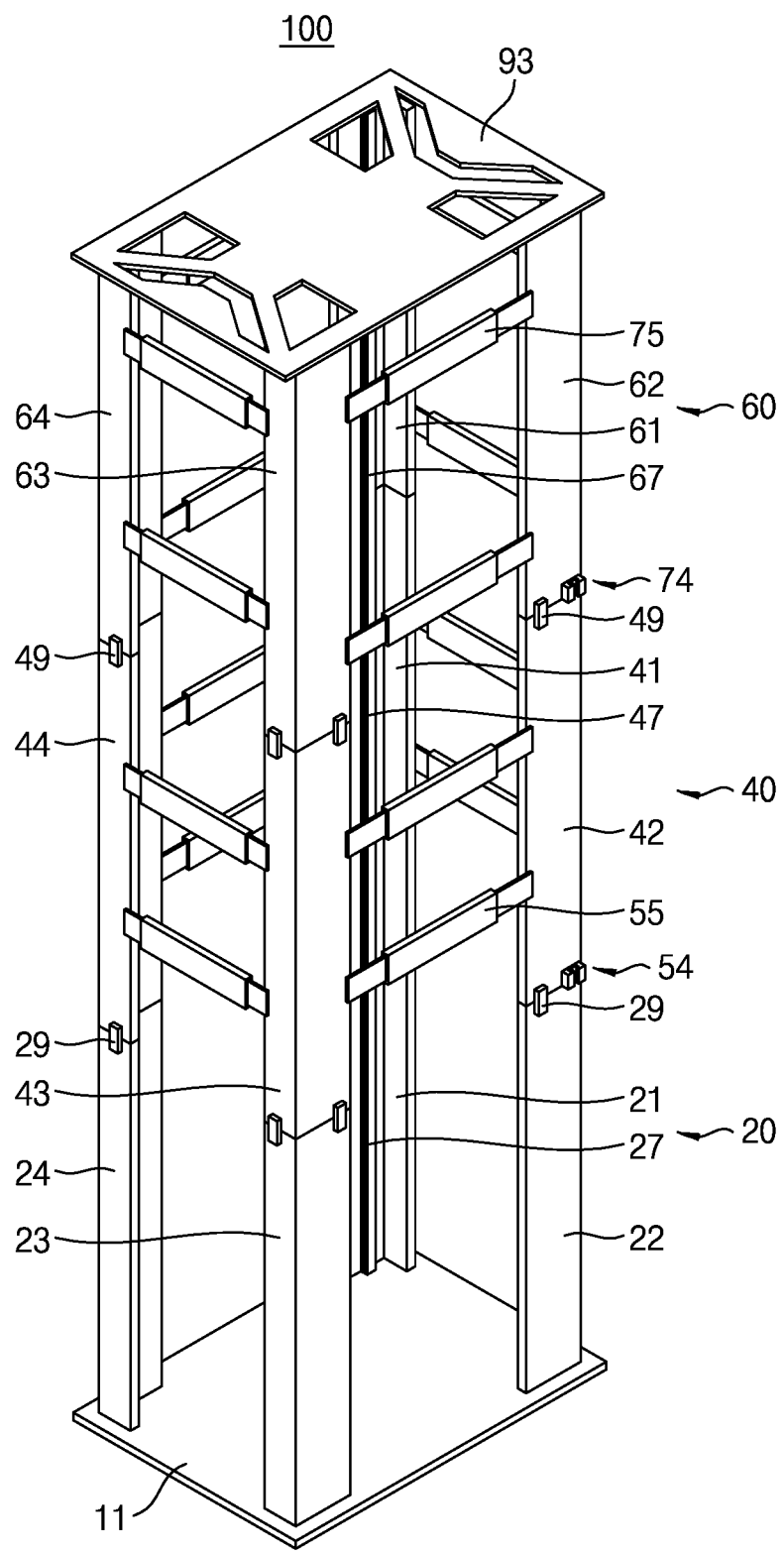
FIG. 1 is a perspective view of a crane according to exemplary embodiments of the disclosure.

FIG. 1 is a perspective view of a crane 100 according to exemplary embodiments of the disclosure.

Referring to FIG. 1, the crane 100 according to exemplary embodiments of the disclosure includes a lower plate 11, a lower module 20, a middle module 40, an upper module 60, and an upper plate 93.

The lower module 20 includes a plurality of lower profiles 21, 22, 23 and 24, a plurality of lower elevation guides 27, and a plurality of lower stoppers 29. The middle module 40 includes a plurality of middle profiles 41, 42, 43 and 44, a plurality of middle elevation guides 47, a plurality of middle stoppers 49, a plurality of middle guide blocks 54, and a plurality of middle expandable plates 55. The upper module 60 includes a plurality of upper profiles 61, 62, 63 and 64, a plurality of upper elevation guides 67, a plurality of upper guide blocks 74, and a plurality of expandable plates 75.

Figure 2:
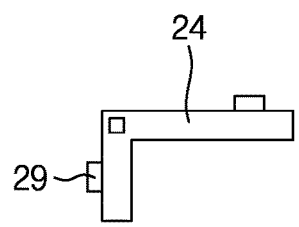
FIGS. 2, 5, 10, and 12 are layouts of portions of FIG. 1.
Figure 2:
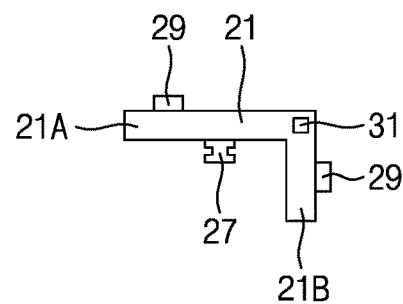
Figure 2:
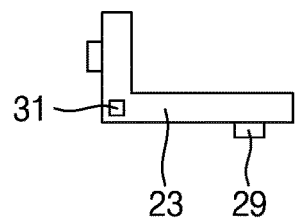
Figure 2:
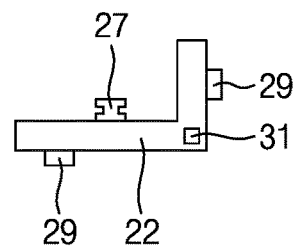
Figure 3:
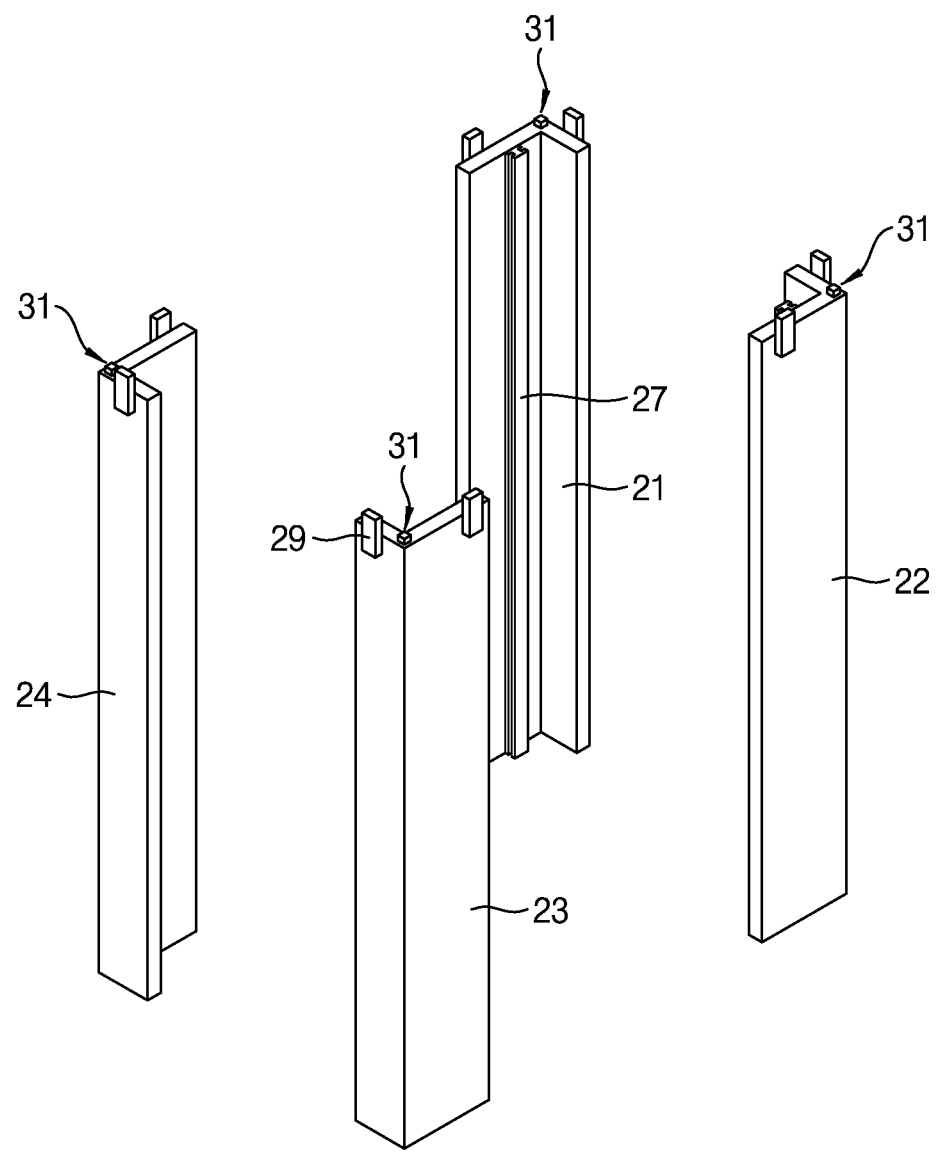
FIGS. 3, 6, and 11 are perspective views of portions of FIG. 1.
Figure 4:
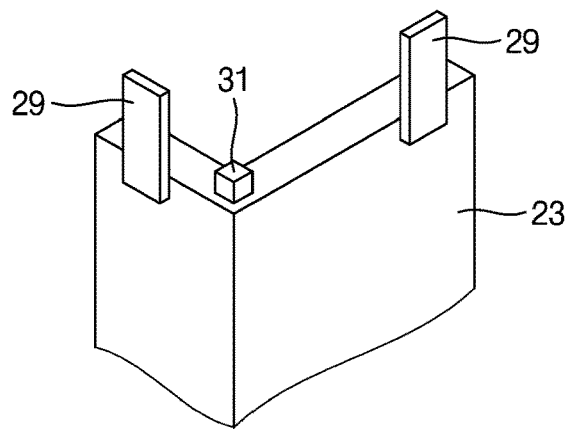
FIG. 4 is a partial view of a portion of FIG. 3.

FIG. 2 is a layout of the lower module 20 of FIG. 1, FIG. 3 is a perspective view of the lower module 20 of FIG. 1. In an embodiment, FIG. 2 a schematic viewed from the top side of FIG. 3. FIG. 4 is a partial view of a portion of FIG. 3.

Referring to FIG. 2, in an embodiment, the lower module 20 includes a plurality of lower profiles 21, 22, 23 and 24, a plurality of lower elevation guides 27, a plurality of lower stoppers 29, and a plurality of lower positioning pins 31. The plurality of lower profiles 21, 22, 23 and 24 include a first lower profile 21, a second lower profile 22, a third lower profile 23, and a fourth lower profile 24.

In an embodiment, the first lower profile 21 includes a first portion 21A and a second portion 21B. The second portion 21B intersects the first portion 21A. The second portion 21B perpendicularly intersects the first portion 21A. The second portion 21B is continuous with one end of the first portion 21A. The intersection of second portion 21B and the first portion 21A forms a corner. Each of the second lower profile 22, the third lower profile 23, and the fourth lower profile 24 includes a configuration similar to that of the first lower profile 21.

The plurality of lower profiles 21, 22, 23 and 24 are spaced apart from each other. The plurality of lower profiles 21, 22, 23 and 24 are respectively disposed at corners of a rectangular shape. For example, the second lower profile 22 faces the first lower profile 21, and the fourth lower profile 24 faces the third lower profile 23, The third lower profile 23 faces the first lower profile 21 in a diagonal direction, and the fourth lower profile 24 faces the second lower profile 22 in a diagonal direction.

The plurality of lower elevation guides 27 are disposed on the insides of the first lower profile 21 and the second lower profile 22. Each of the plurality of lower elevation guides 27 contacts the inside of a corresponding first lower profile 21 or second lower profile 22. Each of the plural ty of lower elevation guides 27 may have one of various shapes. For example, each of the plurality of lower elevation guides 27 has a rail shape.

The plurality of lower stoppers 29 contact outside surfaces of the plurality of lower profiles 21, 22, 23 and 24. For example, one of the plurality of lower stoppers 29 contacts an outside surface of the first portion 21A. Another one of the plurality of lower stoppers 29 contacts an outside surface of the second portion 21B.

The plurality of lower positioning pins 31 are disposed on the plurality of lower profiles 21, 22, 23 and 24. For example, one of the plurality of lower positioning pins 31 is disposed on a earlier of the first lower profile 21. One of the plurality of lower positioning pins 31 is disposed at an intersection between the first portion 21A and the second portion 21B.

Referring to FIG. 3, in an embodiment, the lower module 20 includes the plurality of lower profiles 21, 22, 23 and 24, the plurality of lower elevation guides 27, the plurality of lower stoppers 29, and the plurality of lower positioning pins 31.

Each of the plurality of lower profiles 21, 22, 23 and 24 has a vertical height greater than a horizontal width thereof. Each of the plurality of lower profiles 21, 22, 23 and 24 has substantially the same vertical length. Each of the plurality of lower elevation guides 27 contacts an inside surface of a corresponding first lower profile 21 or second lower profile 22. Each of the plurality of lower elevation guides 27 has substantially the same vertical length as a corresponding first lower profile 21 or second lower profile 22.

The plurality of lower stoppers 29 are disposed in an upper region of the plurality of lower profiles 21, 22, 23 and 24. A lower end of each of the plurality of lower stoppers 29 is located at a lower level than an uppermost surface of a corresponding lower profile 21, 22, 23 or 24. The plurality of lower stoppers 29 contact the outside surfaces of the plurality of lower profiles 21, 22, 23 and 24. An upper end of each of the plurality of lower stoppers 29 protrudes above a level of an uppermost surface of a corresponding lower profile 21, 22, 23 or 24.

The plurality of lower positioning pins 31 are disposed on the upper corners of the plurality of lower profiles 21, 22, 23 and 24. The plurality of lower positioning pins 31 contact upper surfaces of the plurality of lower profiles 21, 22, 23 and 24. An uppermost end of each of the plurality of lower positioning pins 31 protrudes above a level of an upper surface of a corresponding lower profile 21, 22, 23 or 24.

Referring to FIG. 4, in an embodiment, the plurality of lower stoppers 29 are disposed on an outside surface of the third lower profile 23. Each of the plurality of lower stoppers 29 protrudes above a level of an uppermost end of the third lower profile 23. One of the plurality of lower positioning pins 31 is disposed at an upper surface of the third lower profile 23. One of the plurality of lower positioning pins 31 protrudes above a level of the uppermost end of the third lower profile 23. Although the lower positioning pin 31 is shown as having a hexahedral shape, this is for convenience of illustration, and the lower positioning pins 31 may have any of various shapes such as a circular column shape, an ameba shape, a dumbbell shape, a rail shape, or a combination thereof.

The plurality of lower profiles 21, 22, 23 and 24, the plurality of lower stoppers 29, and the plurality of lower positioning pins 31 have configurations similar to those shown in FIG. 4.

Figure 5:
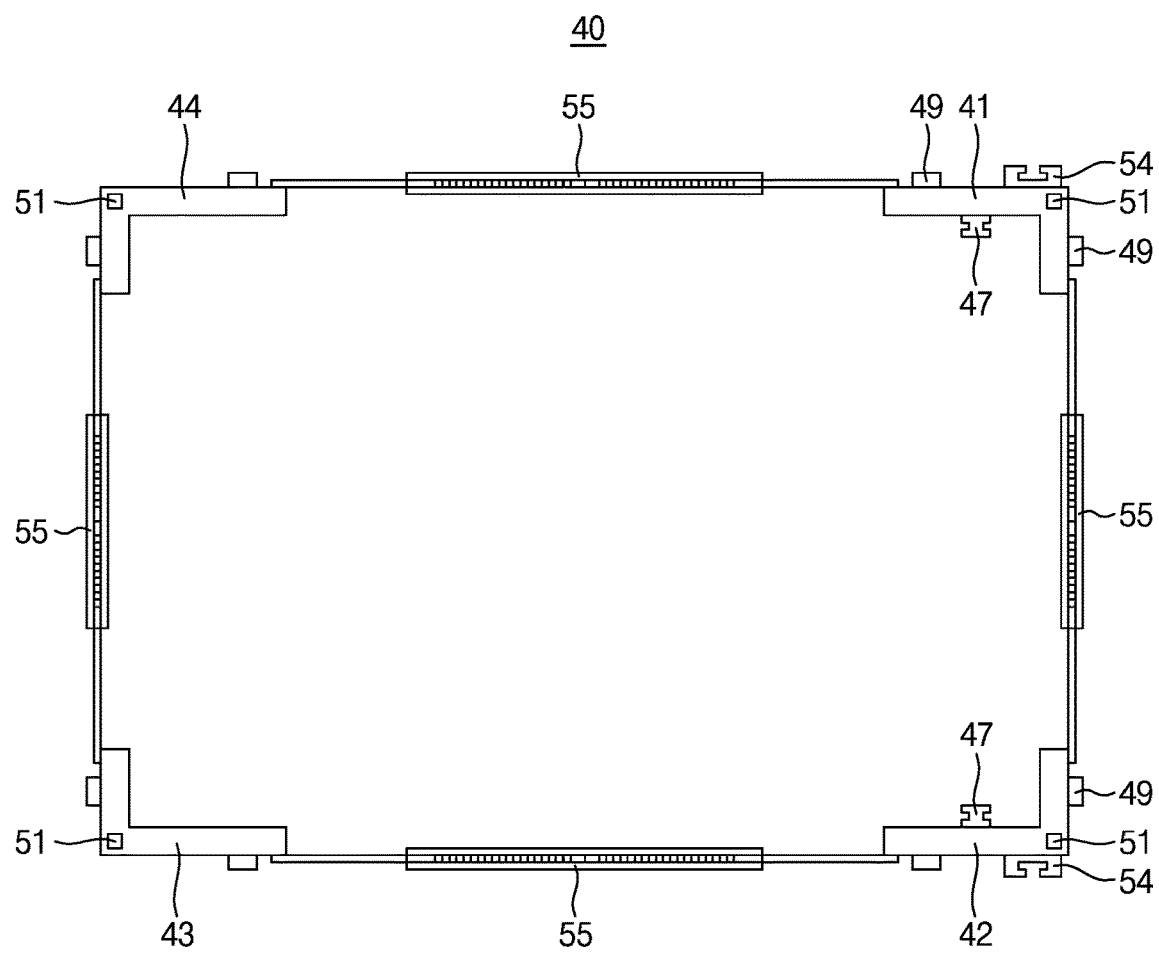
Figure 6:
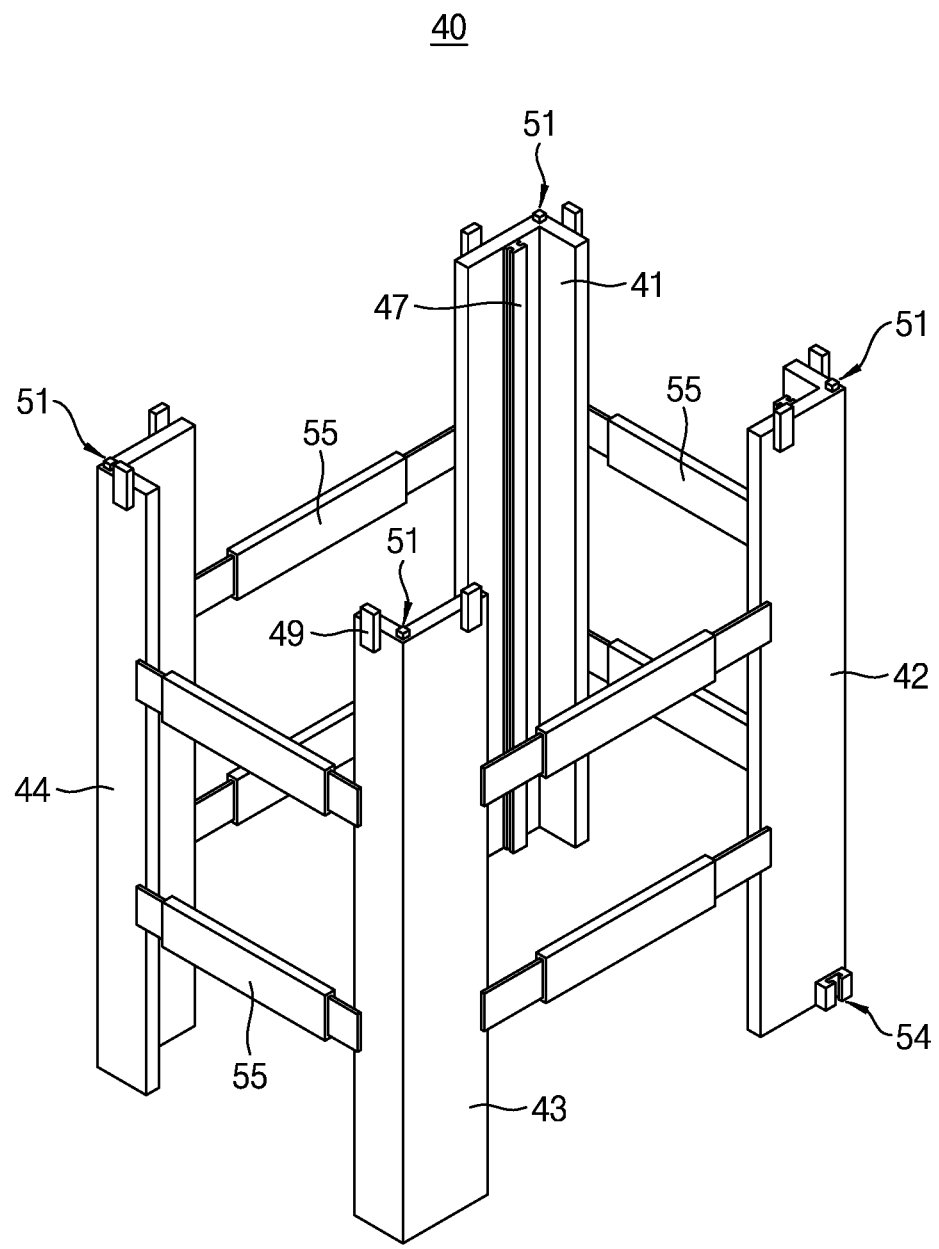
Figure 7:
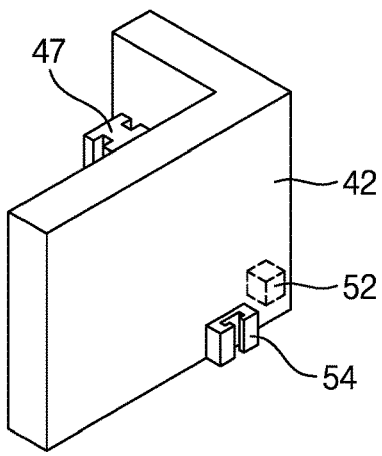
FIG. 7 is a partial view of a portion of FIG. 6.
Figure 8:
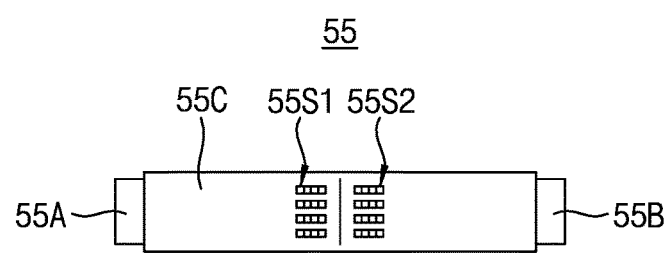
FIGS. 8 and 9 are schematic views of a portion of FIG. 1.
Figure 9:
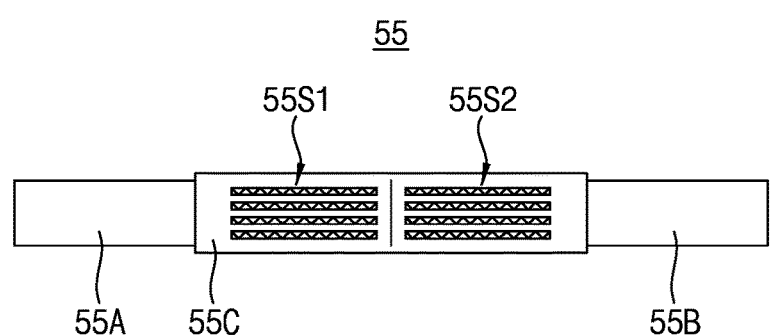

FIG. 5 is a layout of a portion of FIG. 1. FIG. 6 is a perspective view of a portion of FIG. 1. In an embodiment, FIG. 5 is a schematic viewed from the top side of FIG. 6. FIG. 7 is a partial view of a portion of FIG. 6. FIGS. 8 and 9 are schematic views of a portion of FIG. 1.

Referring to FIG. 5, in an embodiment, the middle module 40 include a plurality of middle profiles 41, 42, 43 and 44, a plurality of middle elevation guides 47, a plurality of middle stoppers 49, a plurality of middle positioning pins 51, a plurality of middle guide blocks 54, and a plurality of middle expandable plates 55. The plurality of middle profiles 41, 42, 43 and 44 include a first middle profile 41, a second middle profile 42, a third middle profile 43 and a fourth middle profile 44.

The plurality of middle profiles 41, 42, 43 and 44 have a configuration similar to that of the plurality of lower profiles 21, 22, 23 and 24. The plurality of middle profiles 41, 42, 43 and 44 are spaced apart from one another. The plurality of middle profiles 41, 42, 43 and 44 are disposed at corners of a rectangular shape, respectively. For example, the second middle profile 42 faces the first middle profile 41, and the fourth middle profile 44 faces the third middle profile 43. The third middle profile 43 faces the first middle profile 41 in a diagonal direction, and the fourth middle profile 44 faces the second middle profile 42 in a diagonal direction.

The plurality of middle elevation guides 47 are disposed on the insides of the first middle profile 41 and the second middle profile 42. Each of the plurality of middle elevation guides 47 contacts the inside of a corresponding first middle profile 41 or the second middle profile 42. Each of the plurality of middle elevation guides 47 has a shape similar to that of each of the plurality of lower elevation guides 27. For example, each of the plurality of middle elevation guides 47 has a rail shape.

The plurality of middle stoppers 49 contact outside surfaces of the plurality of middle profiles 41, 42, 43 and 44. The plurality of middle positioning pins 51 are respectively disposed on the corners of the plurality of middle profiles 41, 42, 43 and 44.

The plurality of middle guide blocks 54 are disposed on the outsides of the first middle profile 41 and the second middle profile 42. Each of the plurality of middle guide blocks 54 contacts the outside of a corresponding profile of the first middle profile 41 and the second middle profile 42. Each of the plurality of middle guide blocks 54 has a shape that enables the middle guide block 54 to be coupled to a corresponding lower elevation guide 27.

The plurality of middle expandable plates 55 are disposed between the plurality of middle profiles 41, 42, 43 and 44, respectively. For example, the plurality of middle expandable plates 55 respectively connect the first and second middle profiles 41 and 42, the second and third middle profiles 42 and 43, the third and fourth middle profiles 43 and 44, and the fourth and first middle profiles 44 and 41. The plurality of middle expandable plates 55 contact the outside surfaces of the plurality of middle profiles 41, 42, 43 and 44. The plurality of middle expandable plates 55 are vertically spaced apart from one another.

Referring to FIG. 6, in an embodiment, the middle module 40 includes the plurality of middle profiles 41, 42, 43 and 44, the plurality of middle elevation guides 47, the plurality of middle stoppers 49, the plurality of middle positioning pins 51, the plurality of middle guide blocks 54, and the plurality of middle expandable plates 55.

Each of the plurality of middle profiles 41, 42, 43 and 44 has a vertical height greater than a horizontal width thereof. Each of the plurality of middle profiles 41, 42, 43 and 44 has substantially the same vertical length.

Each of the plurality of middle elevation guides 27 contacts an inside surface of a corresponding first middle profile 41 or the second middle profile 42. Each of the plurality of middle elevation guides 47 has substantially the same vertical length as a corresponding first middle profile 41 or second middle profile 42.

The plurality of middle stoppers 49 are disposed in an upper region of the plurality of middle profiles 41, 42, 43 and 44. A lower end of each of the plurality of middle stoppers 49 is located at a lower level than an uppermost surface of corresponding middle profile 41, 42, 43 or 44. The plurality of middle stoppers 49 contact the outside surfaces of the plurality of middle profiles 41, 42, 43 and 44. An upper end of each of the plurality of middle stoppers 49 protrudes above a level of an uppermost surface of a corresponding middle profile 41, 42, 43 or 44.

The plurality of middle positioning pins 51 are disposed on upper corners of the plurality of middle profiles 41, 42, 43 and 44. The plurality of middle positioning pins 51 contact upper surfaces of the plurality of middle profiles 41, 42, 43 and 44. An uppermost end of each of the plurality of middle positioning pins 51 protrudes above a level of an upper surface of a corresponding middle profile 41, 42, 43 or 44. Each of the plurality of middle positioning pins 51 has a configuration similar to that of the lower positioning pin 31 (see FIG. 4). Each of the plurality of middle positioning pins 51 has substantially the same shape as a corresponding lower positioning pin 31 (see FIG. 3).

The plurality of middle guide blocks 54 are disposed at an outside lower region of the first middle profile 41 and the second middle profile 42. The plurality of middle guide blocks 54 contact the outsides of the first middle profile 41 and the second middle profile 42. Each of the plurality of middle guide blocks 54 has a shape that enables the middle guide block 54 to be coupled to a corresponding lower elevation guide 27.

The plurality of middle expandable plates 55 contact the outside surfaces of the plurality of middle profiles 41, 42, 43 and 44. The plurality of middle expandable plates 55 are spaced apart from each other. For example, pairs of the plurality of middle expandable plates 55 are disposed between adjacent pairs of the plurality of middle profiles 41, 42, 43 and 44, respectively.

Referring to FIG. 7, in an embodiment, a positioning hole 52 is disposed at a lower corner of the second middle profile 42. Each of the plurality of middle profiles 41, 42, 43 and 44 includes the positioning hole 52. The positioning hole 52 has a shape that enables the positioning hole 52 to be coupled to the lower positioning pin 31 (see FIG. 4). For example, the positioning hole 52 extends inwards from a lower surface of the second middle profile 42.

One of the plurality of middle guide blocks 54 is disposed on an outside lower region of the second profile 42. One of the plurality of middle elevation guides 47 is disposed on an inside surface of the second middle profile 42.

Referring to FIGS. 8 and 9, in an embodiment, the plurality of middle expandable plates 55 include a structure having a variable width. For example, the plurality of middle expandable plates 55 include various kinds of elastic members such as a coil spring, a plate spring, or a combination thereof. The plurality of middle expandable plates 55 include at least one of an elastic member, a shape memory structure, or a combination thereof.

In an embodiment, each of the plurality of middle expandable plates 55 includes a first plate 55A, a second plate 55B, a third plate 55C, and a plurality of springs 55S1 and 55S2. The second plate 55B is opposite to the first plate 55A. The third plate 55C is disposed between the first plate 55A and the second plate 55B. The third plate 55C overlaps the first plate 55A and the second plate 55B. The plurality of springs 55S1 and 55S2 are mounted within the third plate 55C. For example, each of the plurality of springs 55S1 and 55S2 includes at least one of a coil spring, a plate spring, or a combination thereof.

The plurality of springs 55S1 and 55S2 include a plurality of first springs 55S1 and a plurality of second springs 55S2. The plurality of first springs 55S1 are connected between the first plate 55A and the third plate 55C. The plurality of second springs 55S2 are connected between the second plate 55B and the third plate 55C. As shown in FIG. 8, each of the plurality of middle expandable plates 55 has a smaller horizontal width in a compressed state than in an expanded state. As shown in FIG. 9, each of the plurality of middle expandable plates 55 has a greater horizontal width in an expanded state than in a compressed state.

Figure 10:
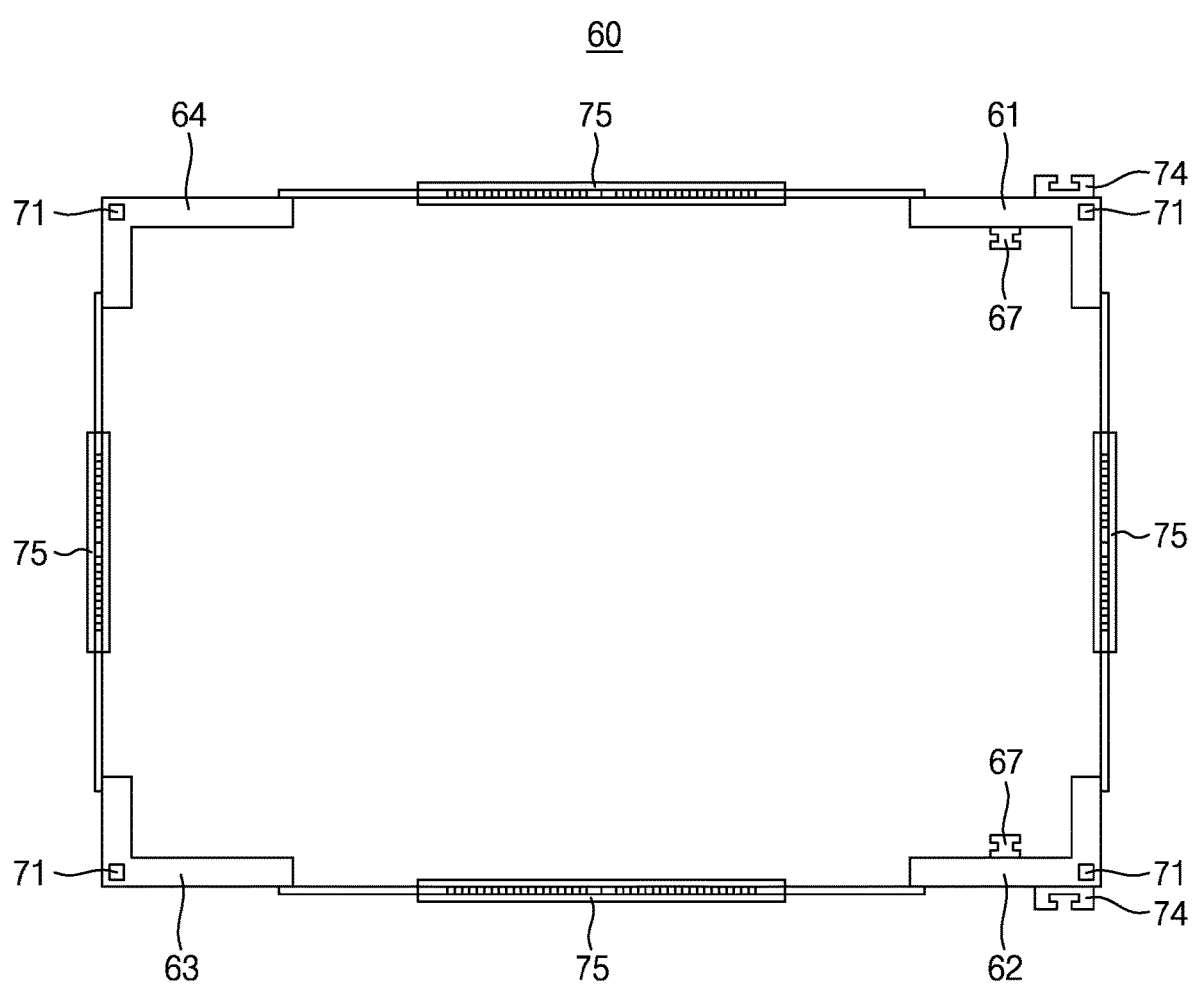
Figure 11:
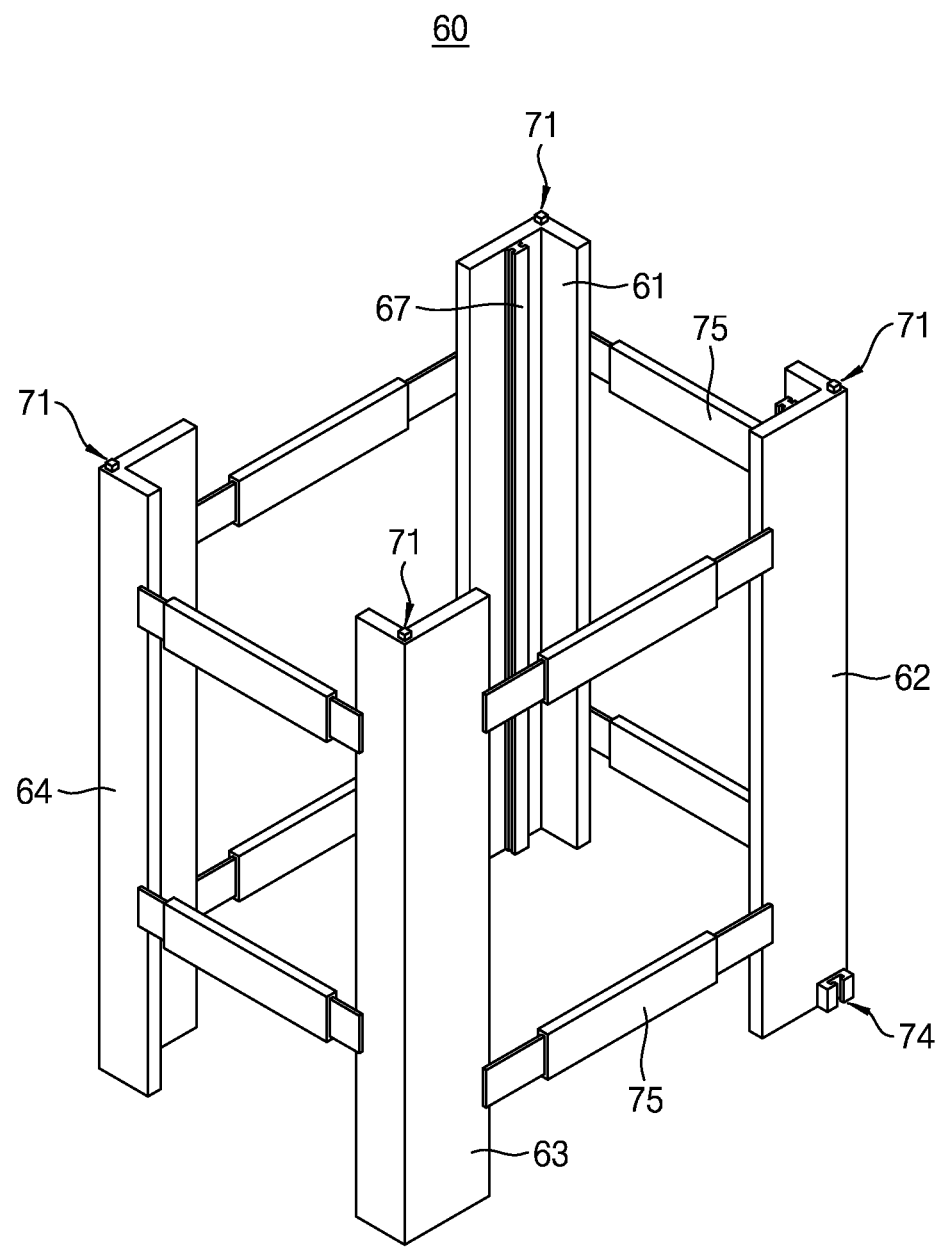

FIG. 10 is a layout of a portion of FIG. 1. FIG. 11 is a perspective view of a portion of FIG. 1. In an embodiment, FIG. 10 is a schematic viewed from the top side of FIG. 11.

Referring to FIG. 10, in an embodiment, the upper module 60 includes a plurality of upper profiles 61, 62, 63 and 64, a plurality of upper elevation guides 67, a plurality of upper cam followers 71, a plurality of upper guide blocks 74, and a plurality of upper expandable plates 75. The plurality of upper profiles 61, 62, 63 and 64 include a first upper profile 61, a second upper profile 62, a third upper profile 63 and a fourth upper profile 64.

The plurality of upper profiles 61, 62, 63 and 64 have a configuration similar to those of the plurality of middle profiles 41, 42, 43 and 44 and the plurality of lower profiles 21, 22, 23 and 24, The plurality of upper profiles 61, 62, 63 and 64 are spaced apart from each other. The plurality of upper profiles 61, 62, 63 and 64 are disposed at corners of a rectangular shape, respectively. For example, the second upper profile 62 faces the first upper profile 61, and the fourth upper profile 64 faces the third upper profile 63. The third upper profile 63 faces the first upper profile 61 in a diagonal direction, and the fourth upper profile 64 faces the second upper profile 62 in a diagonal direction.

The plurality of upper elevation guides 67 are disposed on the insides of the first upper profile 61 and the second upper profile 62. Each of the plurality of upper elevation guides 47 contacts the inside of a corresponding first upper profile 61 or second upper profile 62. Each of the plurality of upper elevation guides 67 has a shape similar to those of each of the plurality of middle elevation guides 47 and each of the plurality of lower elevation guides 27. For example, each of the plurality of upper elevation guides 67 has a rail shape.

The plurality of upper cam followers 71 are disposed on the plurality of upper profiles 61, 62, 63 and 64.

The plurality of upper guide blocks 74 are disposed on the outside of the first upper profile 61 and the second upper profile 62. Each of the plurality of upper guide blocks 74 contacts the outside of a corresponding first upper profile 61 or second upper profile 62. Each of the plurality of upper guide blocks 74 has a shape that enables the upper guide block 74 to be coupled to a corresponding middle elevation guide 47.

The plurality of upper expandable plates 75 are disposed between the plurality of upper profiles 61, 62, 63 and 64, respectively. For example, the plurality of upper expandable plates 75 respectively connect the first and second upper profiles 61 and 62, the second and third upper profiles 62 and 63, the third and fourth upper profiles 63 and 64, and the fourth and first upper profiles 64 and 61. The plurality of upper expandable plates 75 contact the outside surfaces of the plurality of upper profiles 61, 62, 63 and 64. The plurality of upper expandable plates 75 are vertically spaced apart from each other.

Referring to FIG. 11, in an embodiment, the upper module 60 includes the plurality of upper profiles 61, 62, 63 and 64, the plurality of upper elevation guides 67, the plurality of upper cam followers 71, the plurality of upper guide blocks 74, and the plurality of upper expandable plates 75.

Each of the plurality of upper profiles 61, 62, 63 and 64 has a vertical height greater than a horizontal width thereof. Each of the plurality of upper profiles 61, 62, 63 and 64 has substantially the same vertical length.

Each of the plurality of upper elevation guides 67 contacts art inside surface of a corresponding first upper profile 61 or the second upper profile 62. Each of the plurality of upper elevation guides 67 has substantially the same vertical length as a corresponding first upper profile 61 or second upper profile 62.

The plurality of upper cam followers 71 are disposed on upper corners of the plurality of upper profiles 61, 62, 63 and 64. The plurality of upper cam followers 71 contact upper surfaces of the plurality of upper profiles 61, 62, 63 and 64. An uppermost end of each of the plurality of upper cam followers 71 protrudes above a level of the upper surface of a corresponding upper profile 61, 62, 63 or 64. Each of the plurality of upper cam followers 71 has a configuration similar to those of the plurality of middle positioning pins 51 and the plurality of lower positioning pins 31 (see FIG. 4).

The plurality of upper guide blocks 74 are disposed on art outside lower region of the first upper profile 61 and the second upper profile 62. The plurality of upper guide blocks 74 contact the outsides of the first upper profile 61 and the second upper profile 62. Each of the plurality of upper guide blocks 64 has a shape that enables the upper guide block 64 to be coupled to a corresponding middle elevation guide 47.

The plurality of upper expandable plates 75 contact the outside surfaces of the upper profiles 61, 62, 63 and 64. The plurality of upper expandable plates 75 are spaced apart from each other. For example, pairs of the plurality of upper expandable plates 75 are disposed between adjacent pairs of the plurality of upper profiles 61, 62, 63 and 64, respectively. Each of the plurality of upper expandable plates 75 has a configuration similar to that of the plurality of middle expandable plates 55 described with reference to FIGS. 8 and 9.

Each of the plurality of upper profiles 61, 62, 63 and 64 includes the positioning hole 52 described with reference to FIG. 7.

Figure 12:
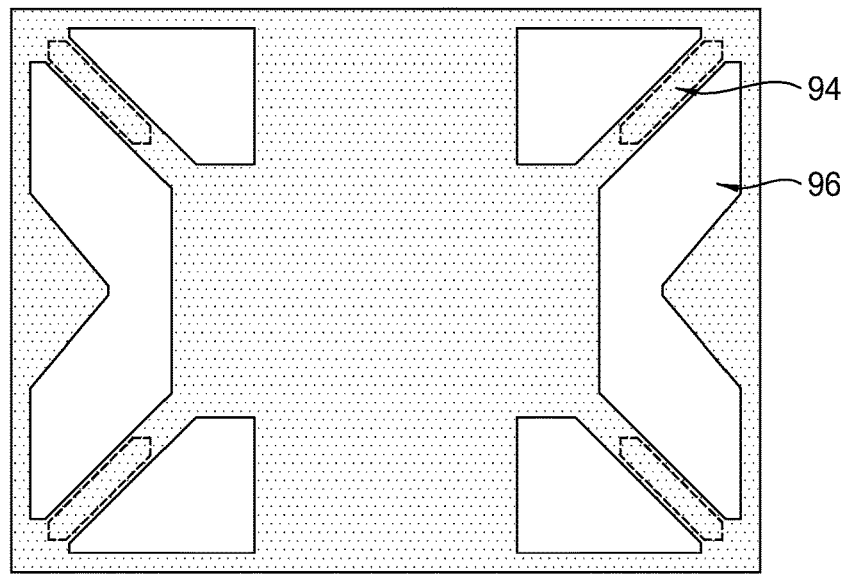

FIG. 12 is a layout of a portion of FIG. 1.

Referring to FIG. 12, in an embodiment, the upper plate 93 includes a plurality of cam guides 94 and a plurality of openings 96. The plurality of cam guides 94 include grooves to which the plurality of cam followers 71 can be coupled, respectively. The plurality of openings 96 are aligned with the plurality of lower stoppers 29 and the plurality of middle stoppers 49.

Referring again to FIGS. 1 to 12, the lower module 20 is disposed on the lower plate 11. The plurality of lower profiles 21, 22, 23 and 24 are mounted at designated positions on the lower plate 11.

The middle module 40 is disposed on the lower module 20. The plurality of middle profiles 41, 42, 43 and 44 are respectively mounted on the plurality of lower profiles 21, 22, 23 and 24. The plurality of middle expandable plates 55 are expanded based on positions of the plurality of lower profiles 21, 22, 23 and 24 and the plurality of lower stoppers 29. Each of the plurality of middle profiles 41, 42, 43 and 44 are disposed over and vertically aligned with a corresponding lower profile 21, 22, 23 or 24. The plurality of lower positioning pins 31 are respectively coupled to the plurality of positioning holes 52 of the plurality of middle profiles 41, 42, 43 and 44.

The plurality of lower stoppers 29 contact the outsides of the plurality of lower profiles 21, 22, 23 and 24 and the plurality of middle profiles 41, 42, 43 and 44. The plurality of lower stoppers 29 are coupled to the outsides of the plurality of lower profiles 21, 22, 23 and 24 and the plurality of middle profiles 41, 42, 43 and 44 using various methods, such as bolting (boil/nut), riveting, welding, clamping, or a combination thereof. Each of the middle elevation guides 47 is disposed over and vertically aligned with a corresponding lower elevation guide 27.

The upper module 60 is disposed on the middle module 40. The plurality of upper profiles 61, 62, 63 and 64 are respectively disposed on the plurality of middle profiles 41, 42, 43 and 44. The plurality of upper expandable plates 75 are expanded based on positions of the plurality of middle profiles 41, 42, 43 and 44, the plurality of middle stoppers 49, and the plurality of lower profiles 21, 22, 23 and 24. Each of the plurality of upper profiles 61, 62, 63 and 64 are disposed over and vertically aligned with a corresponding middle profile 41, 42, 43 or 44. The plurality of middle positioning pins 51 are respectively coupled to the plurality of positioning holes 52 of the plurality of upper profiles 61, 62, 63 and 64.

The plurality of middle stoppers 49 contact the outsides of the plurality of middle profiles 41, 42, 43 and 44 and the plurality of upper profiles 61, 62, 63 and 64. The plurality of middle stoppers 49 are coupled to the outsides of the plurality of middle profiles 41, 42, 43 and 44 and the plurality of upper profiles 61, 62, 63 and 64 using various methods, such as bolting (bolt/nut), riveting, welding, clamping, or a combination thereof. Each of the plurality of elevation guides 67 is disposed over and vertically aligned with a corresponding middle elevation guide 47.

The upper plate 93 is disposed on the upper module 60. The upper plate 93 is mounted on the plurality of upper profiles 61, 62, 63 and 64. The plurality of cam guides 94 are respectively coupled to the plurality of upper cam followers 71. The plurality of upper cam followers 71 are confined by the plurality of cam guides 94.

Each of the lower plate 11, the plurality of lower profiles 21, 22, 23 and 24, the plurality of lower elevation guides 27, the plurality of lower stoppers 29, the plurality of lower positioning pins 31, the plurality of middle profiles 41, 42, 43 and 44, the plurality of middle elevation guides 47, the plurality of middle stoppers 49, the plurality of middle positioning pins 51, the plurality of middle guide blocks 54, the plurality of middle expandable plates 55, the plurality of upper profiles 61, 62, 63 and 64, the plurality of upper elevation guides 67, the plurality of upper cam followers 71, the plurality of upper guide blocks 74, the plurality of upper expandable plates 75, and the upper plate 93 include at least one of a metal, an engineering plastic, graphite, graphene, or a combination thereof. In an embodiment, each of the lower plate 11, the plurality of lower profiles 21, 22, 23 and 24, the plurality of lower elevation guides 27, the plurality of lower stoppers 29, the plurality of lower positioning pins 31, the plurality of middle profiles 41, 42, 43 and 44, the plurality of middle elevation guides 47, the plurality of middle stoppers 49, the plurality of middle positioning pins 51, the plurality of middle guide blocks 54, the plurality of middle expandable plates 55, the plurality of upper profiles 61, 62, 63 and 64, the plurality of upper elevation guides 67, the plurality of upper cam followers 71, the plurality of upper guide blocks 74, the plurality of upper expandable plates 75, and the upper plate 93 includes one of aluminum, stainless steel, or a combination thereof.

In an embodiment, one or a plurality of other middle modules that include configuration similar to that of the middle module 40 may be additionally disposed between the lower module 20 and the middle module 40, and/or between the middle module 40 and the upper module 60. In an embodiment, the middle module 40 is omitted.

Figure 13:
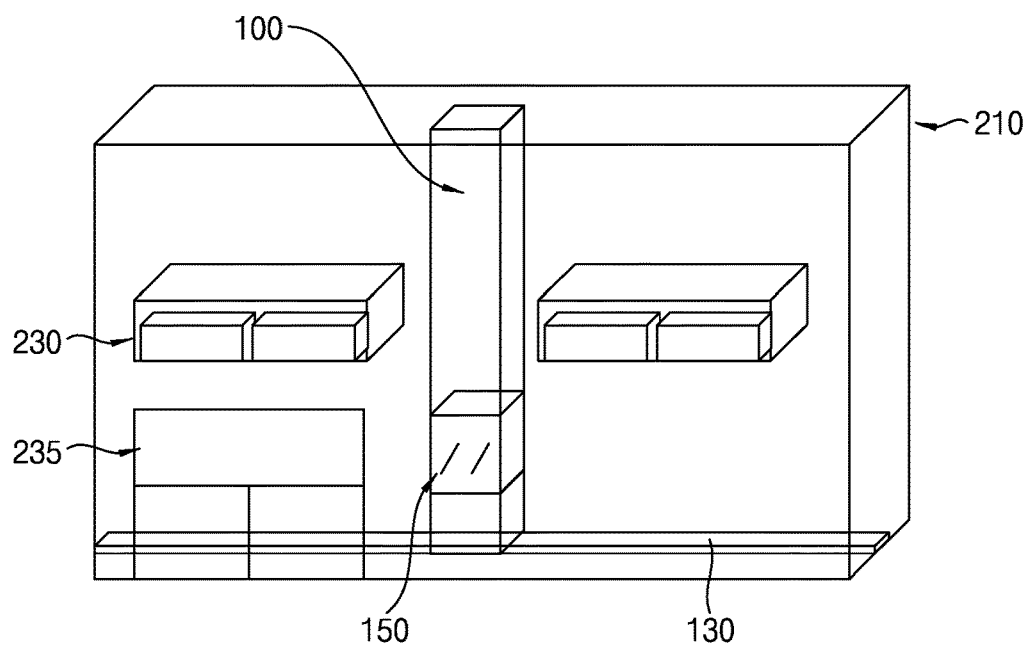
FIG. 13 is a perspective view of a stocker system that includes a crane according to exemplary embodiments of the disclosure.
Figure 14:
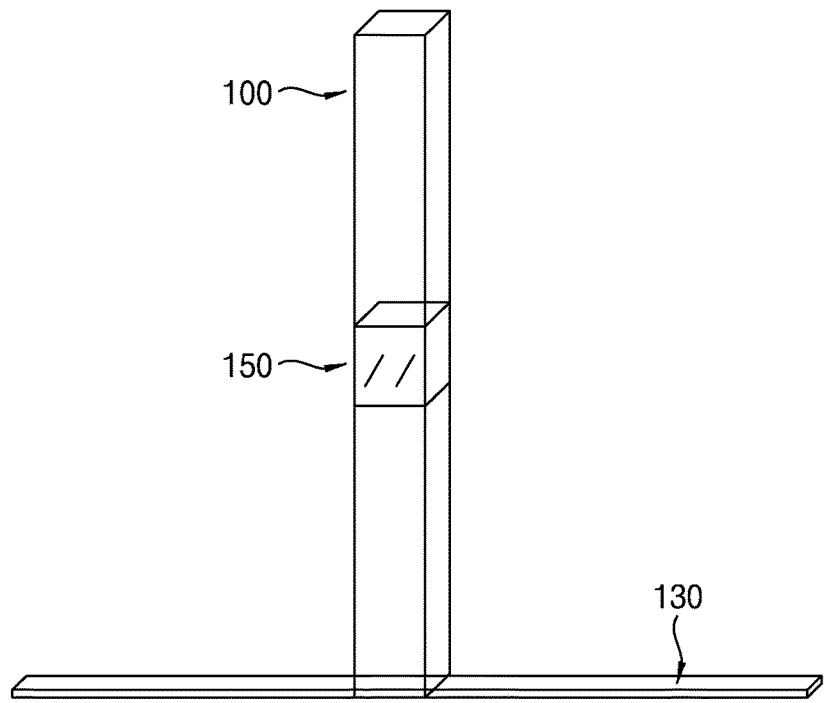
FIGS. 14 and 15 are perspective views of portions of FIG. 13.
Figure 15:
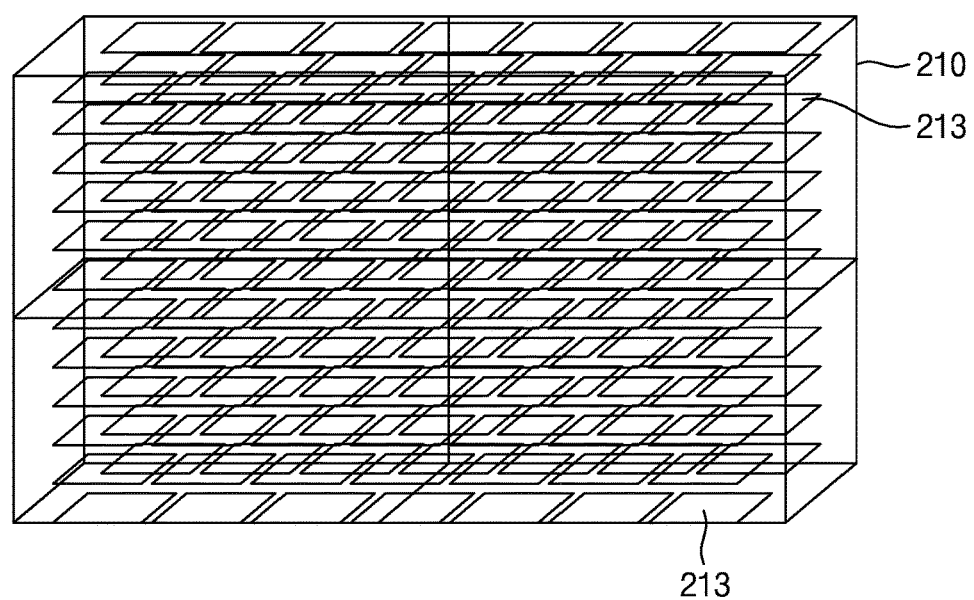

FIG. 13 is a perspective view of a stocker system 1200 that includes a crane according to exemplary embodiments of the disclosure. FIGS. 14 and 15 are perspective views of portions of FIG. 13.

Referring to FIG. 13, the stocker system 1200 according to exemplary embodiments of the disclosure includes a crane 100, a crane base 130, a task robot 150, a main frame 210, a plurality of automatic ports 230, and a manual port 235.

Each of the plurality of automatic ports 230 and the manual port 235 are disposed at one side of the main frame 210. The crane 100 is disposed adjacent to the main frame 210, the plurality of automatic ports 230, and the manual port 235. The crane 100 is disposed on the crane base 130. The task robot 150 is disposed within the crane 100. In an embodiment, the crane 100 and the crane base 130 are disposed within the main frame 210. In an embodiment, the crane 100 and the crane base 130 are disposed outside the main frame 210.

Referring to FIG. 14, in an embodiment, the crane 100 is disposed on the crane base 130. The crane base 130 provides a movement path for the crane 100. The crane 100 can horizontally move along the crane base 130. The task robot 150 is disposed within the crane 100. The crane 100 provides a movement path of the task robot 150. The task robot 150 can move upwards and downwards within the crane 100.

Referring to FIG. 15, in an embodiment, a plurality of shelves 213 are disposed within the main frame 210. In an embodiment, material to be transferred, such as a front opening unified pod (FOUP) or a front opening shipping box (FOSB) that can contain a wafer therein, are stored on the plurality of shelves 213.

Referring again to FIGS. 1 to 15, in an embodiment, the plurality of automatic ports 230 can receive or eject material to be transferred, such as the front opening unified pod (FOUP) or the front opening shipping box (FOSB), from or to a ceiling type transfer device or an automatic transfer device such as an overhead hoist transfer (OTH) device. The manual port 235 can receive or eject a material to be transferred, such as the front opening unified pod (FOUP) or the front opening shipping box (FOSB), from or to an operator.

The crane 100 can move along the crane base 130 to be adjacent to the plurality of automatic ports 230, the manual port 235 or the plurality of shelves 213. The task robot 150 includes a forking robot. The task robot 150 can move upwards and downwards along the plurality of lower elevation guides 27, the plurality of middle elevation guides 47 and the plurality of upper elevation guides 67 within the crane 100.

The task robot 150 can perform horizontal movements and vertical movements by being coupled to the crane 100. The task robot 150 can lift, lower, rotate or move material to be transferred, such as the front opening unified pod (FOUP) or the front opening shipping box (FOSB). The task robot 150 can carry material to be transferred among the plurality of automatic ports 230, the manual port 235 and the plurality of shelves 213.

FIGS. 16 to 24 are perspective views of a crane 100 according to exemplary embodiments of the disclosure.

Figure 16:
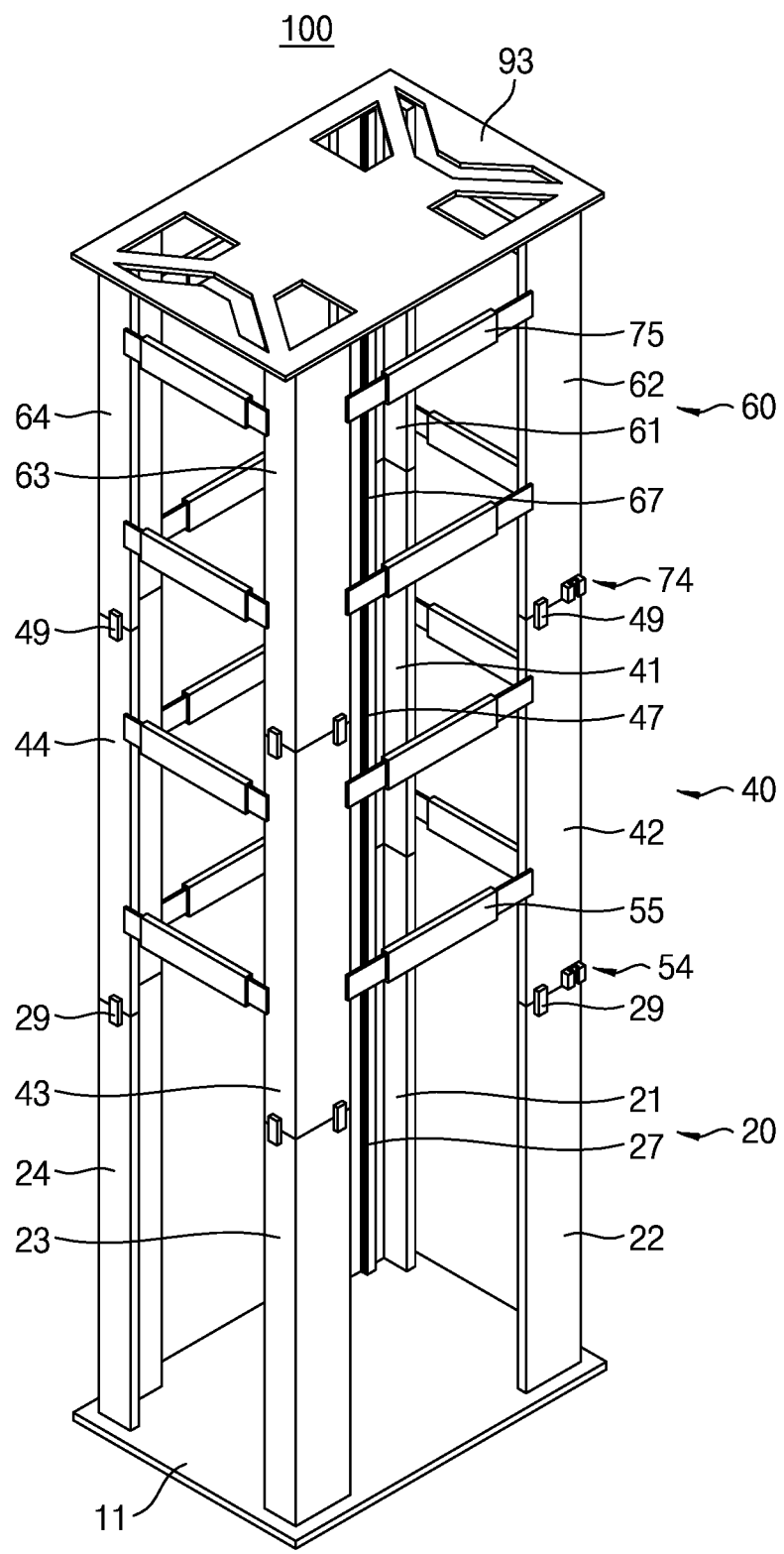
FIGS. 16 to 24 are perspective views of a crane according to exemplary embodiments of the disclosure.

Referring to FIG. 16, in an embodiment, a plurality of middle expandable plates 55 and a plurality of upper expandable plates 75 are disposed using a combination of various spacings and various numbers. In an embodiment, the plurality of middle expandable plates 55 and the plurality of upper expandable plates 75 have substantially the same spacing. For example, a pair of middle expandable plates 55 are disposed between a second middle profile 42 and a third middle profile 43. A pair of upper expandable plates 75 are disposed between a second upper profile 62 and a third upper profile 63. The spacing of the pair of middle expandable plates 55 and the spacing of the pair of upper expandable plates 75 is substantially the same.

Figure 17:
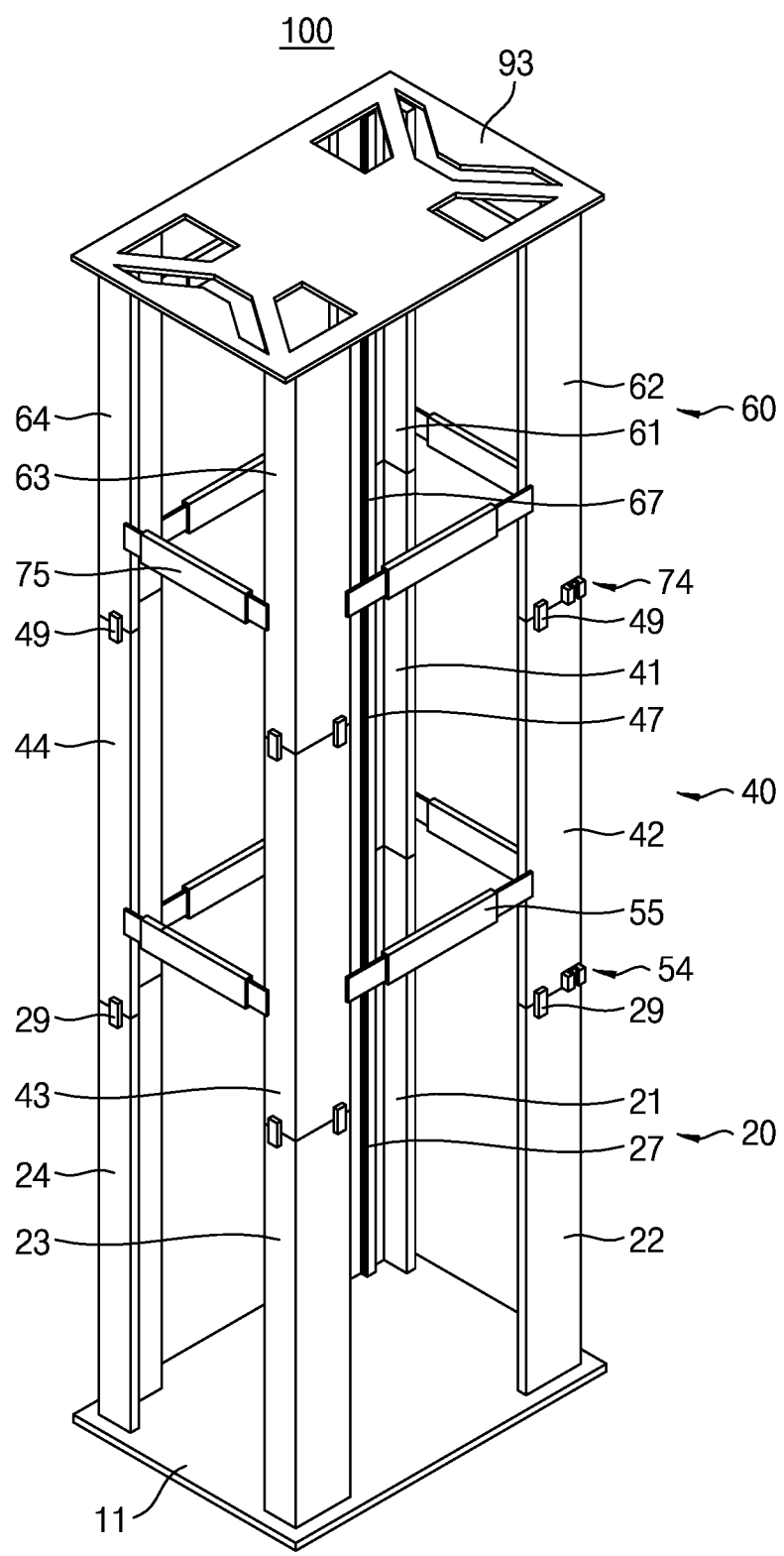

Referring to FIG. 17, in an embodiment, fiddle expandable plates 55 are disposed between a plurality of middle profiles 41, 42, 43 and 44. The middle expandable plates 55 are located at a level that is lower than a center of the plurality of middle profiles 41, 42, 43 and 44. Upper expandable plates 75 are disposed between a plurality of upper profiles 61, 62, 63 and 64. The upper expandable plates 75 are located at a level that is lower than a center of the plurality of upper profiles 61, 62, 63 and 64.

Figure 18:
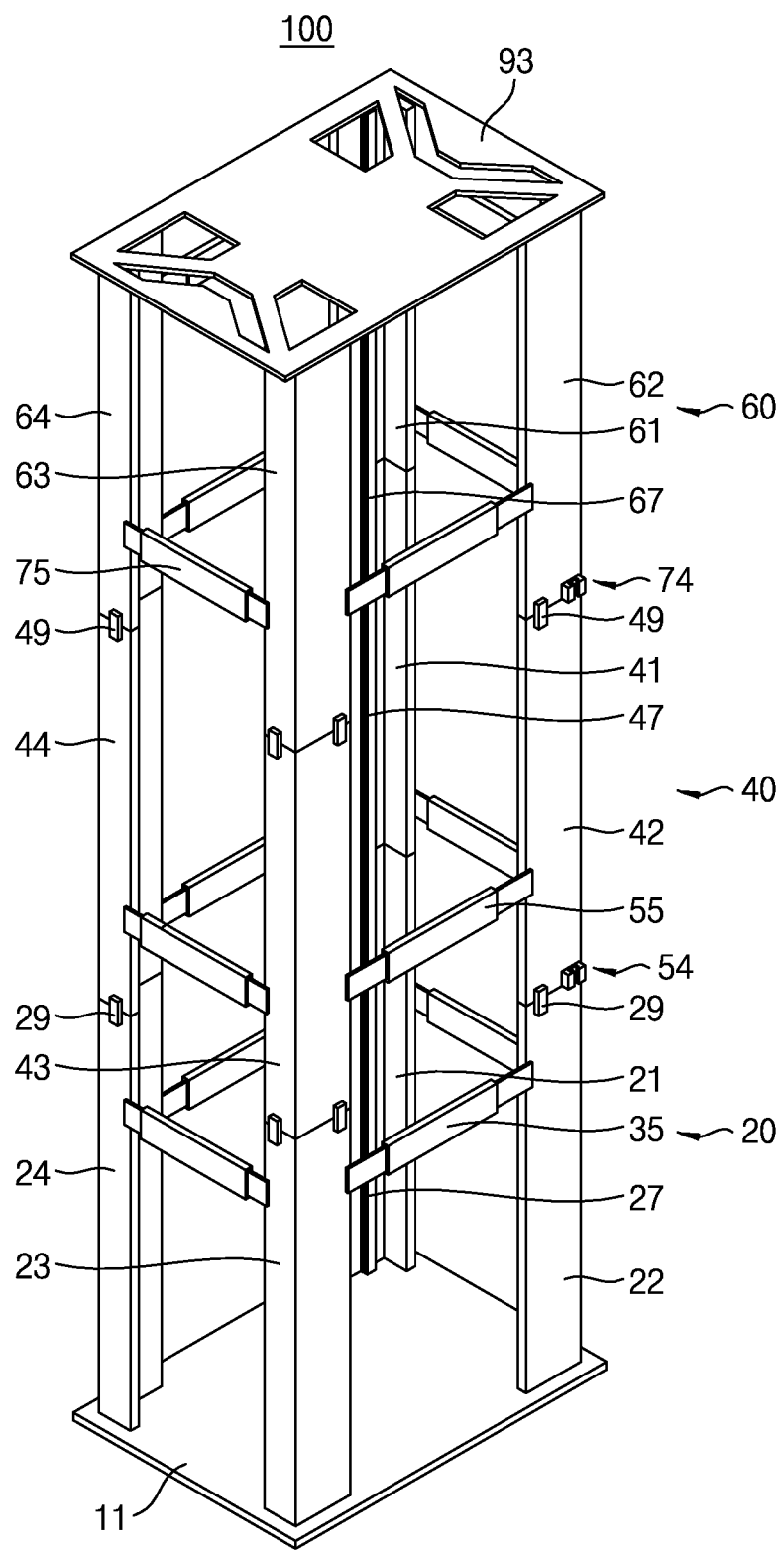

Referring to FIG. 18, in an embodiment, a lower module 20 includes a plurality of lower expandable plates 35. In an embodiment, lower expandable plates 35 are disposed between a plurality of lower profiles 21, 22, 23 and 24. The lower expandable plate 35 are located at a level that is higher than a center of the plurality of lower profiles 21, 22, 23 and 24. The plurality of lower expandable plates 35 have a configuration similar to those of the plurality of middle expandable plates 55 and the plurality of upper expandable plates 75.

Figure 19:
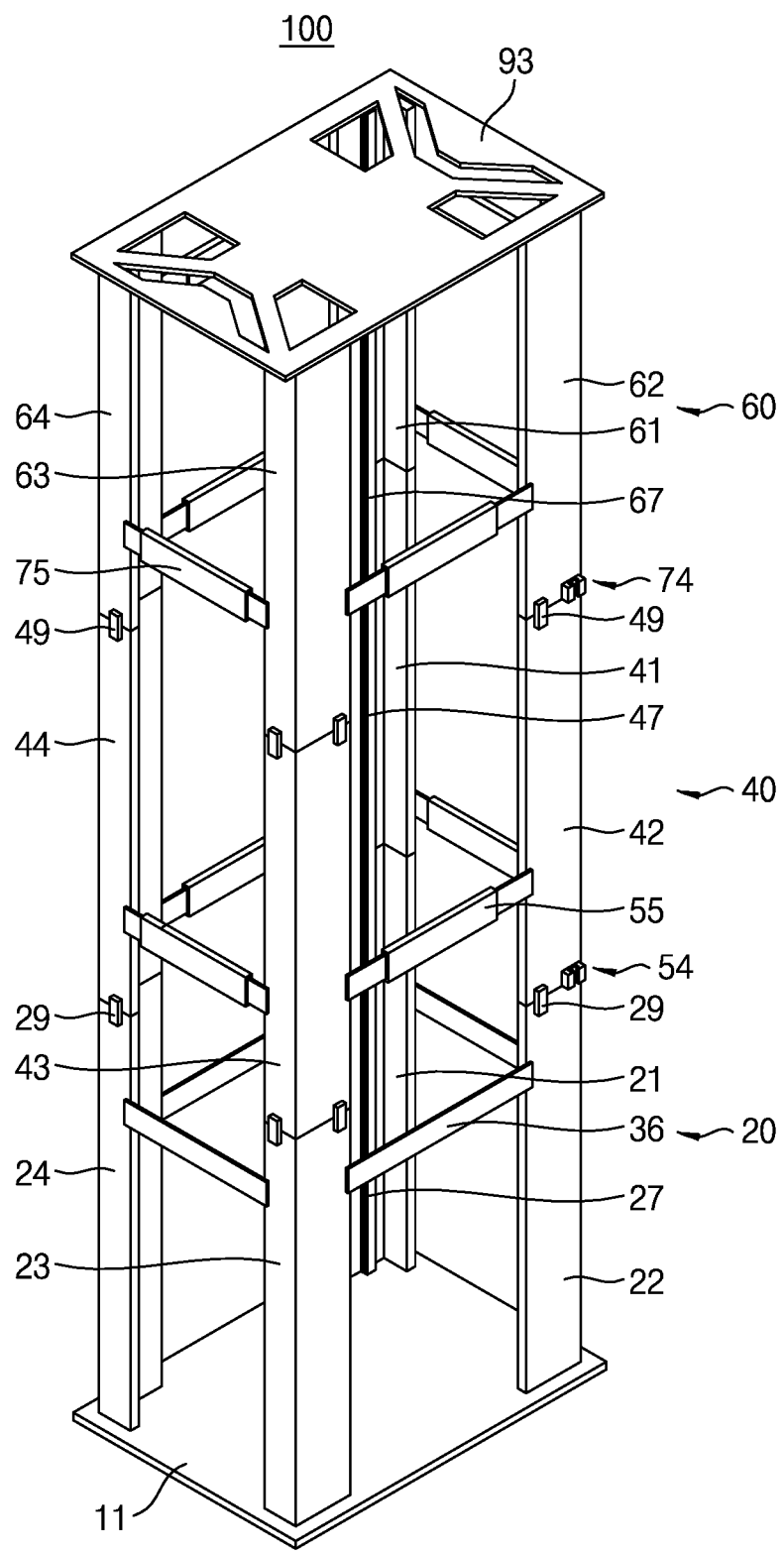

Referring to FIG. 19, in an embodiment, a lower module 20 includes a plurality of lower supports 36. In an embodiment, lower supports 36 are disposed between the plurality of lower profiles 21, 22, 23 and 24. A lower support 36 is disposed between each pair of adjacent lower profiles 21, 22, 23 and 24. The lower supports 36 are located at a level that is higher than a center of the plurality of lower profiles 21, 22, 23 and 24. The plurality of lower supports 36 fix the plurality of lower profiles 21, 22, 23 and 24.

Figure 20:
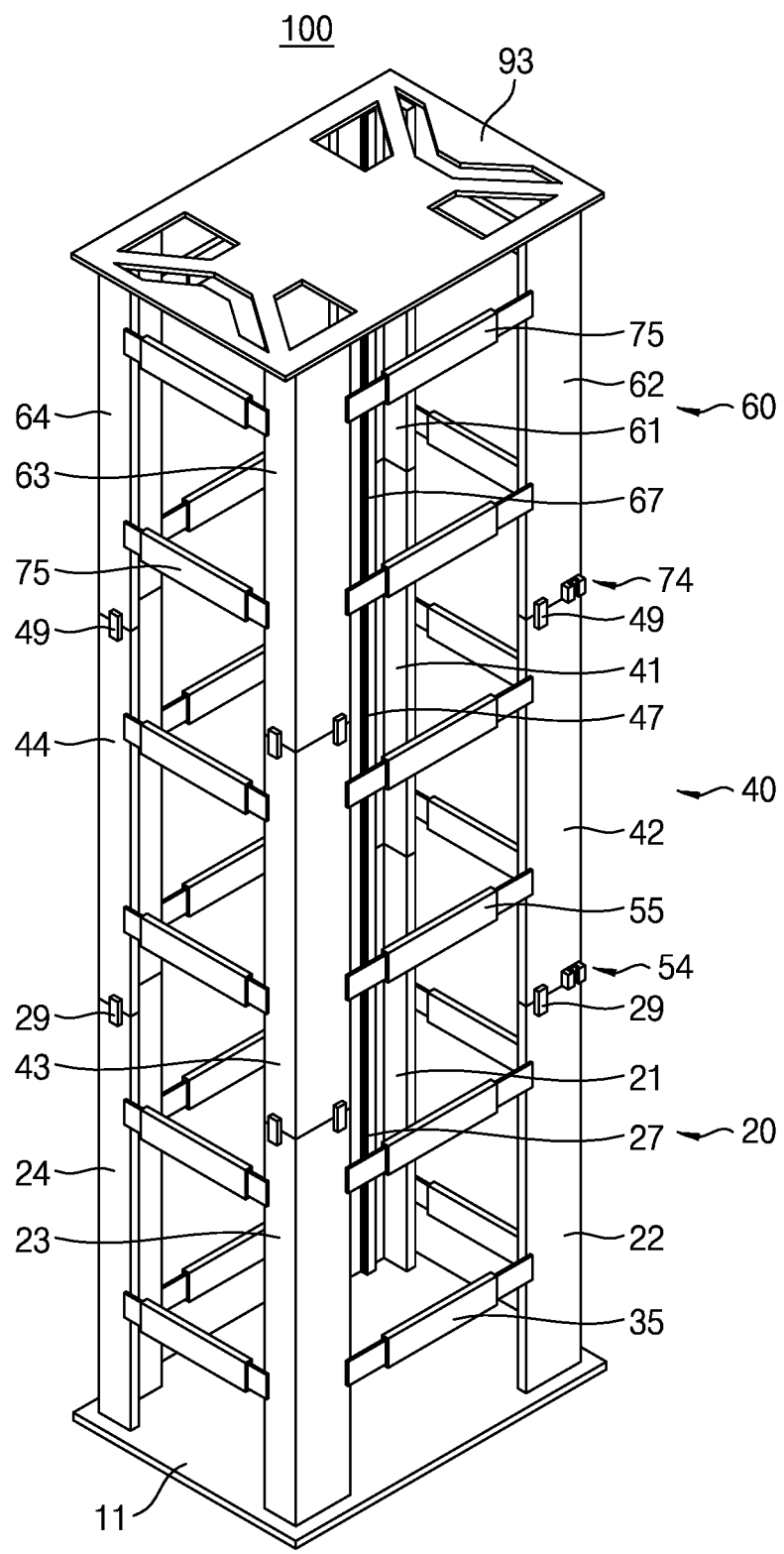

Referring to FIG. 20, in an embodiment, a plurality of lower expandable plates 35 are disposed between a plurality of lower profiles 21, 22, 23 and 24. The plurality of lower expandable plates 35, a plurality of middle expandable plates 55 and a plurality of upper expandable plates 75 have substantially the same spacing in a vertical direction. For example, a pair of lower expandable plates 35 is disposed between a second lower profile 22 and a third lower profile 23. A pair of middle expandable plates 55 is disposed between a second middle profile 42 and a third middle profile 43. A pair of upper expandable plates 75 is disposed between a second upper profile 62 and a third upper profile 63. The vertical spacing of the pair of lower expandable plates 35, the vertical spacing of the pair of middle expandable plates 55 and the vertical spacing of the pair of upper expandable plates 75 are substantially the same.

Figure 21:
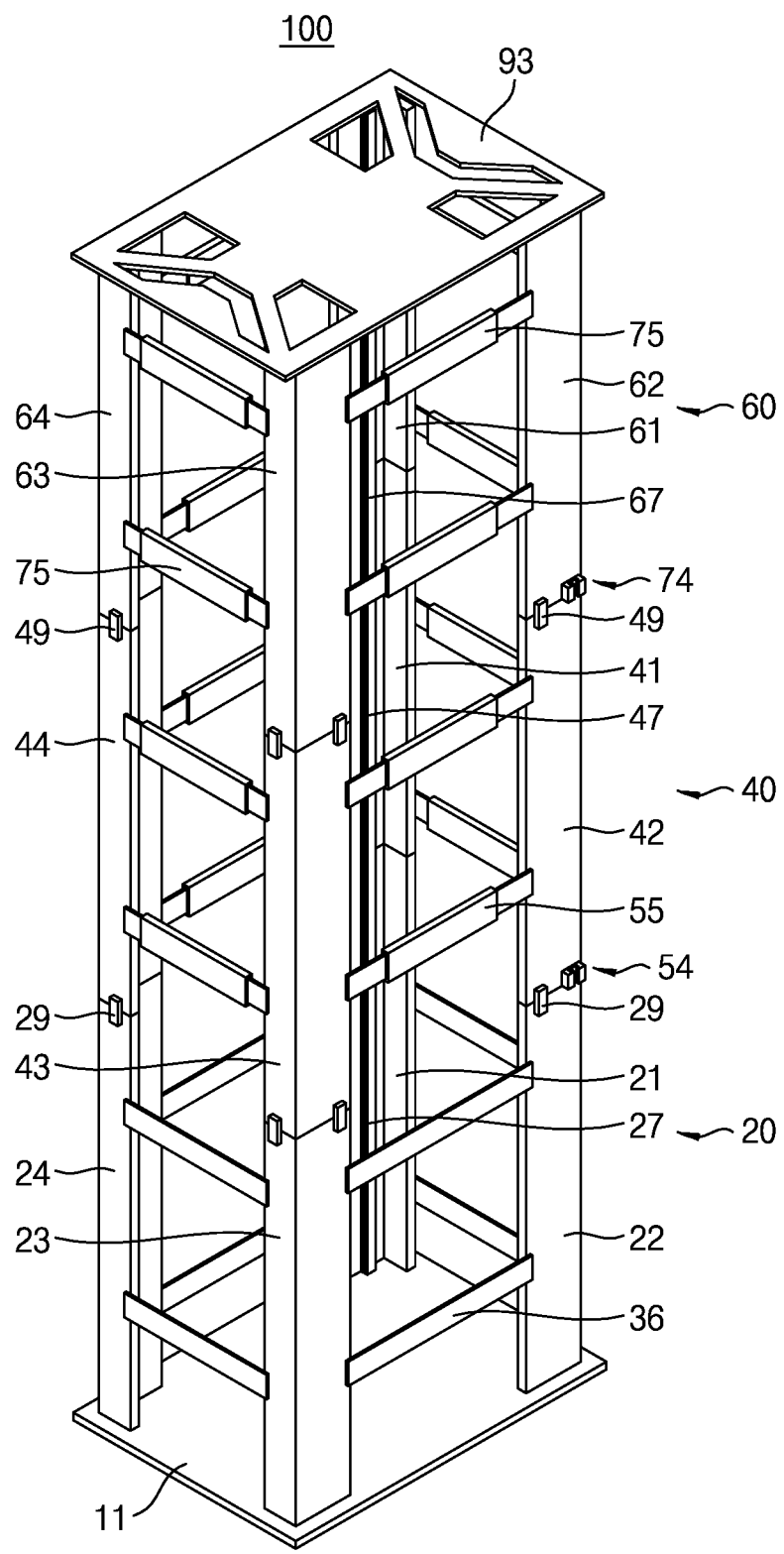

Referring to FIG. 21, in an embodiment, a plurality of lower supports 36 are disposed between the plurality of lower profiles 21, 22, 23 and 24. The plurality of lower supports 36, the plurality of middle expandable plates 55 and the plurality of upper expandable plates 75 have substantially the same vertical spacing.

Figure 22:
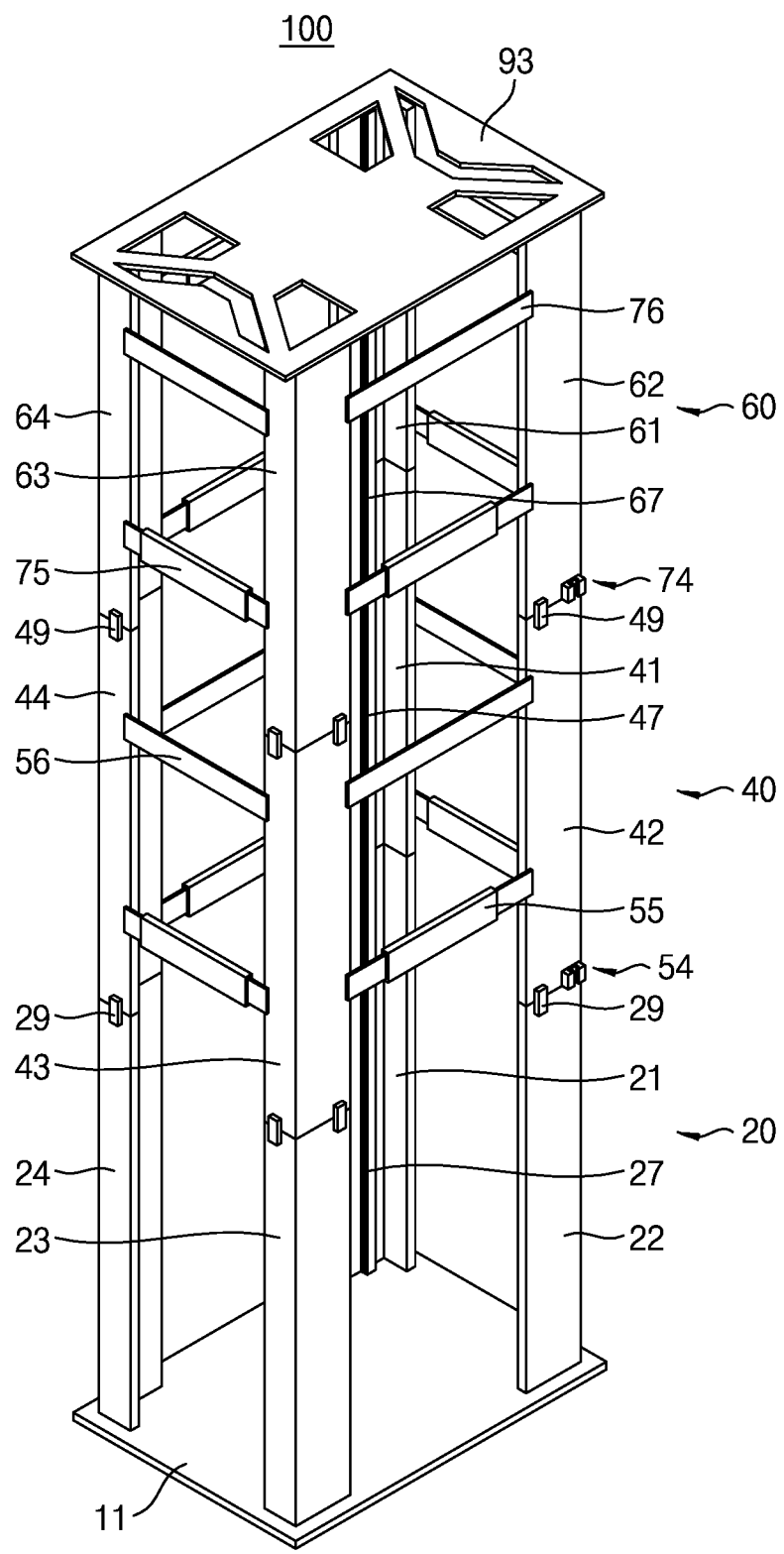

Referring to FIG. 22, in an embodiment, middle supports 56 are disposed between a plurality of middle profiles 41, 42, 43 and 44. The middle support 56 is disposed at a level that is higher than a center of the plurality of middle profiles 41, 42, 43 and 44. Middle expandable plates 55 are disposed between the plurality of middle profiles 41, 42, 43 and 44. The middle expandable plates 55 are disposed at a level that is lower than the center of the plurality of middle profiles 41, 42, 43 and 44.

Upper supports 76 are disposed between a plurality of upper profiles 61, 62, 63 and 64. The upper supports 76 are disposed at a level that is higher than a center of the plurality of upper profiles 61, 62, 63 and 64. Upper expandable plates 75 are disposed between the plurality of upper profiles 61, 62, 63 and 64. The upper expandable plate 75 are disposed at a level that is lower than the center of the plurality of upper profiles 61, 62, 63 and 64. Vertical spacings of the middle expandable plate 55, the middle support 56, the upper expandable plate 75 and the upper support 76 are substantially the same.

Figure 23:
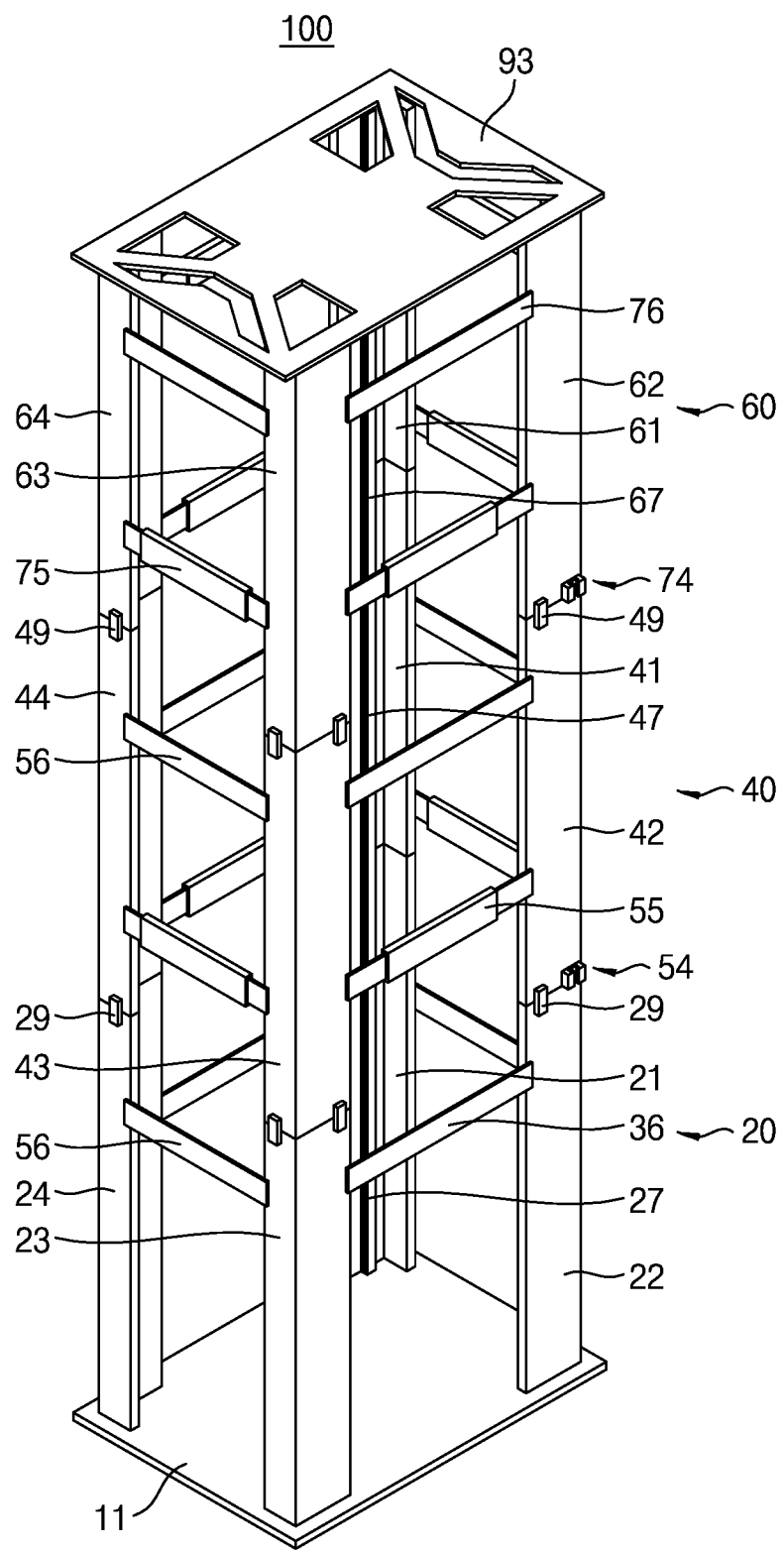

Referring to FIG. 23, in an embodiment, lower supports 36 are disposed between the plurality of lower profiles 21, 22, 23 and 24. The lower supports 36 are disposed at a level that is, higher than a center of the plurality of lower profiles 21, 22, 23 and 24. Vertical spacings of the lower support 36, the middle expandable plate 55, the middle support 56, the upper expandable plate 75 and the upper support 76 are substantially the same.

Figure 24:
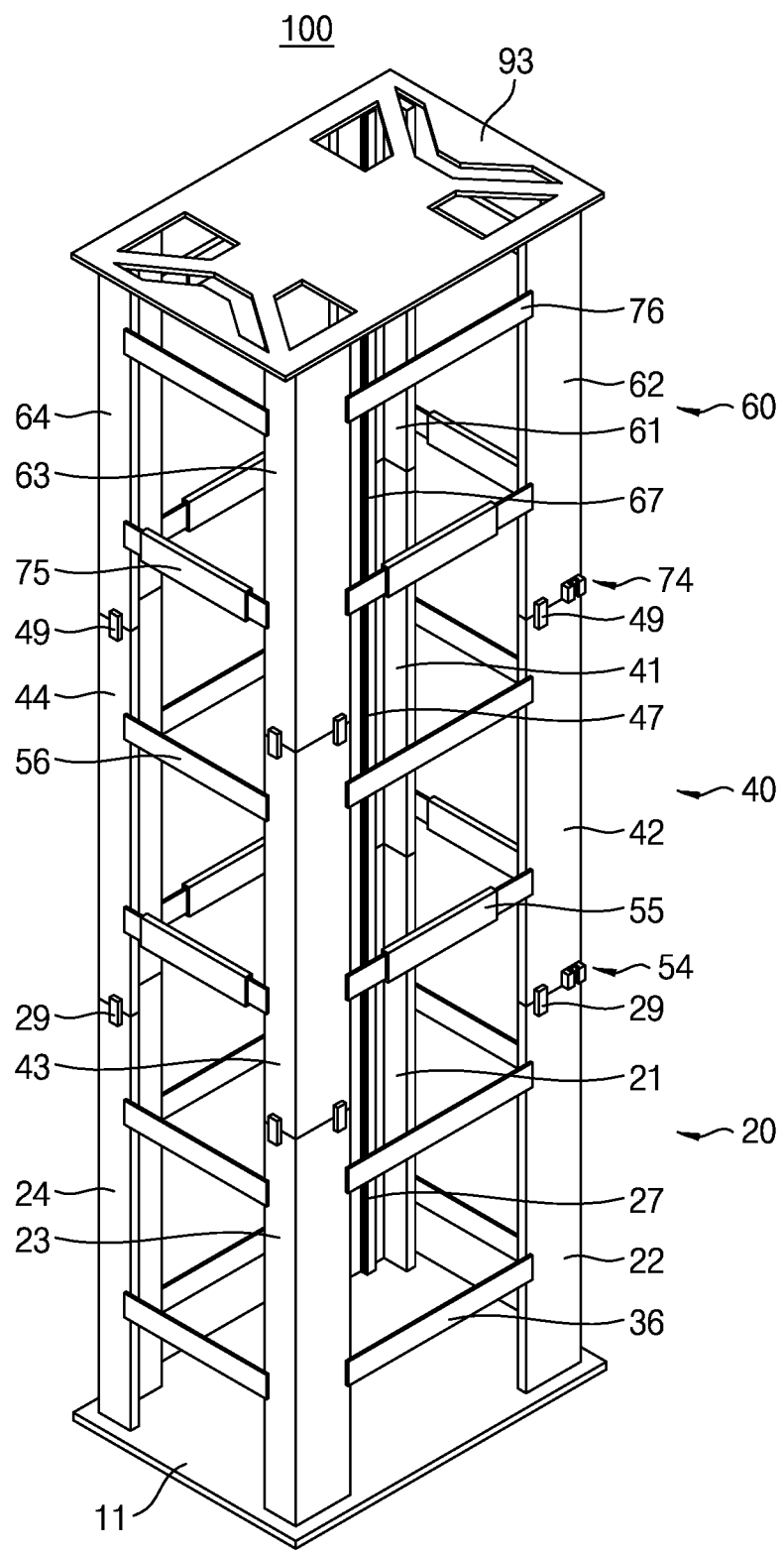

Referring to FIG. 24, in an embodiment, a plurality of lower supports 36 are disposed between plurality of lower profiles 21, 22, 23 and 24. The plurality of lower supports 36, a plurality of middle expandable plates 55, a plurality of middle supports 56, a plurality of upper expandable plates 75, and a plurality of upper supports 76 have substantially the same vertical spacing.

FIGS. 25 to 34 are schematic views that illustrate an installation method of a stocker system that includes a crane according to exemplary embodiments of the disclosure.

Figure 25:
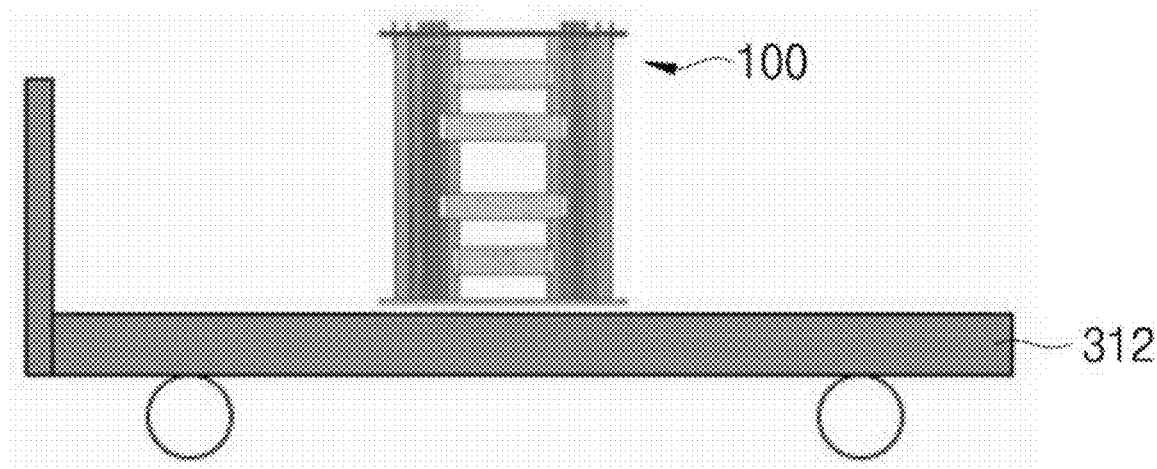
FIGS. 25 to 34 are schematic views that illustrate an installation method of a stocker system that includes a crane according to exemplary embodiments of the disclosure.

Referring to FIG. 25, in an embodiment, a crane 100 is transported using a transport device 312.

Figure 26:
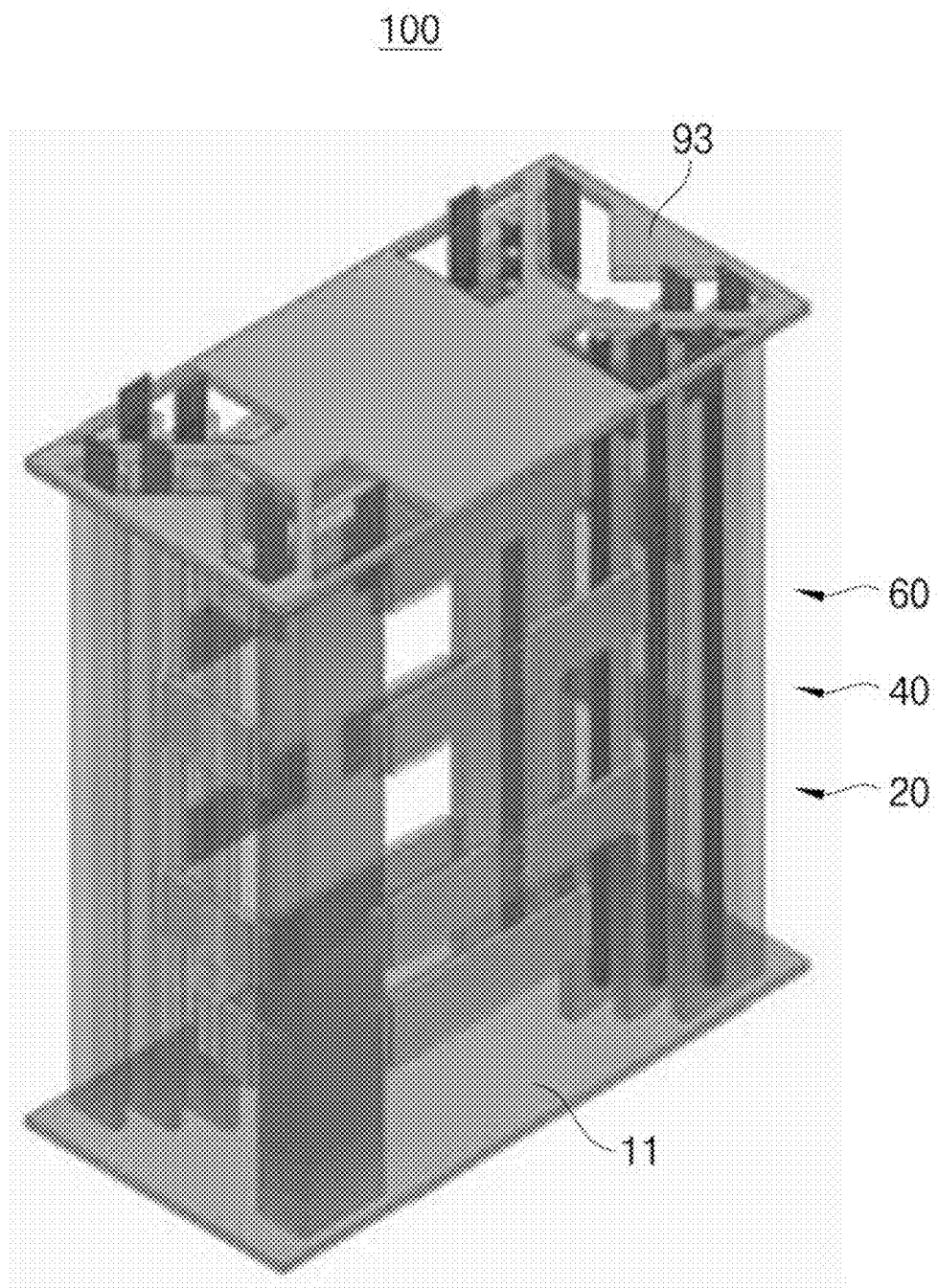

Referring to FIG. 26, in an embodiment, the crane 100 includes a lower plate 11, a lower module 20, a middle module 40, an upper module 60, and an upper plate 93. The lower module 20 is disposed on and fixed to the lower plate 11. The middle module 40 is received within the lower module 20 in a compressed state and, as such, is mounted on the lower plate 11. The upper module 60 is received within the middle module 40 in a compressed state and, as such, is mounted on the lower plate 11. The upper plate 93 covers the lower module 20, the middle module 40 and the upper module 60 in a plan view.

Figure 27:
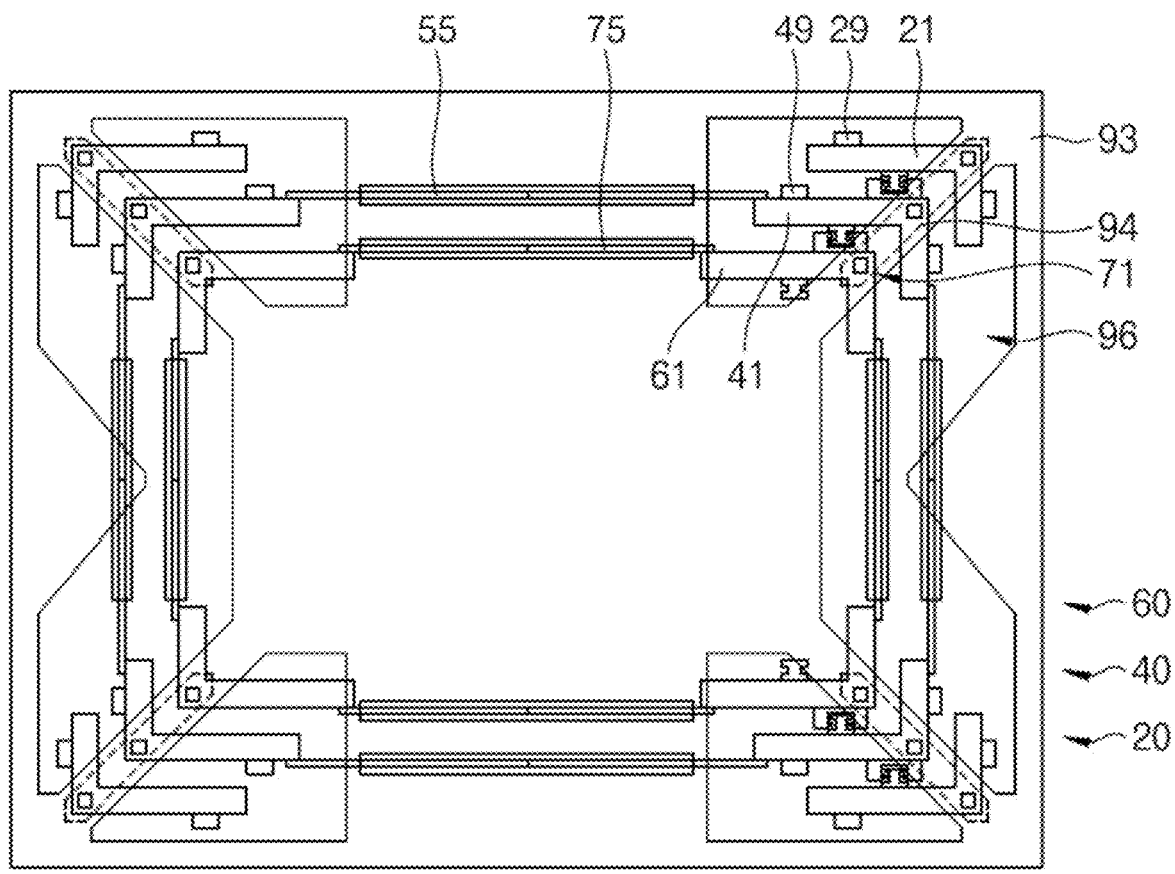
Figure 28:
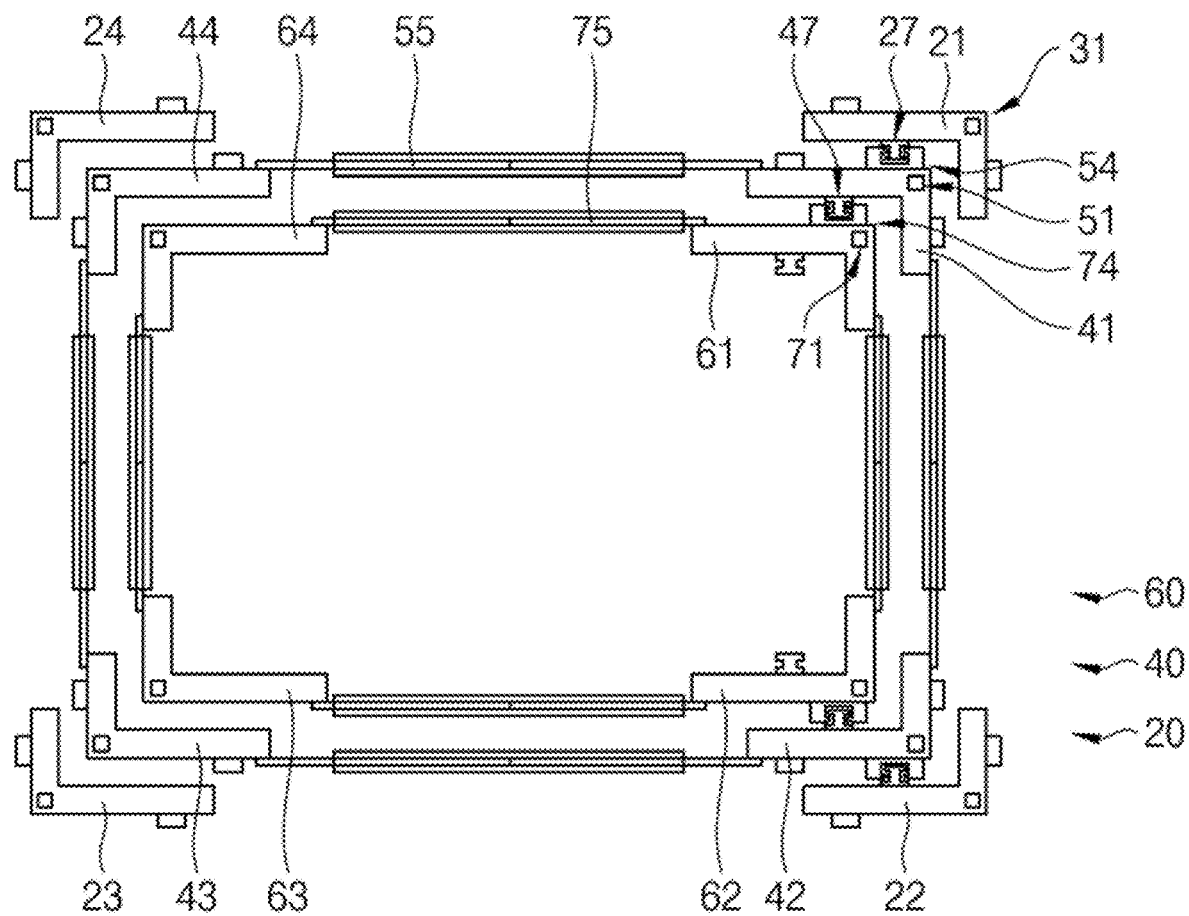

FIG. 27 is a layout as viewed from the top side of the crane 100. FIG. 28 is a schematic view of disposition of the lower module 20, the middle module 40 and the upper module 60, except for the upper plate 93.

Referring to FIGS. 26 and 27, in an embodiment, a plurality of upper cam followers 71 are coupled to a plurality of cam guides 94 of the upper plate 93. The plurality of upper cam followers 71 are confined by the plurality of cam guides 94. A plurality of lower stoppers 29 and a plurality of middle stoppers 49 are disposed in a plurality of openings 96 of the upper plate 93.

Referring to FIGS. 26 to 28, in an embodiment, each of a plurality of middle guide blocks 54 is coupled to a corresponding lower elevation guide 27. Each of a plurality of upper guide blocks 74 is coupled to a corresponding middle elevation guide 47.

Figure 29:
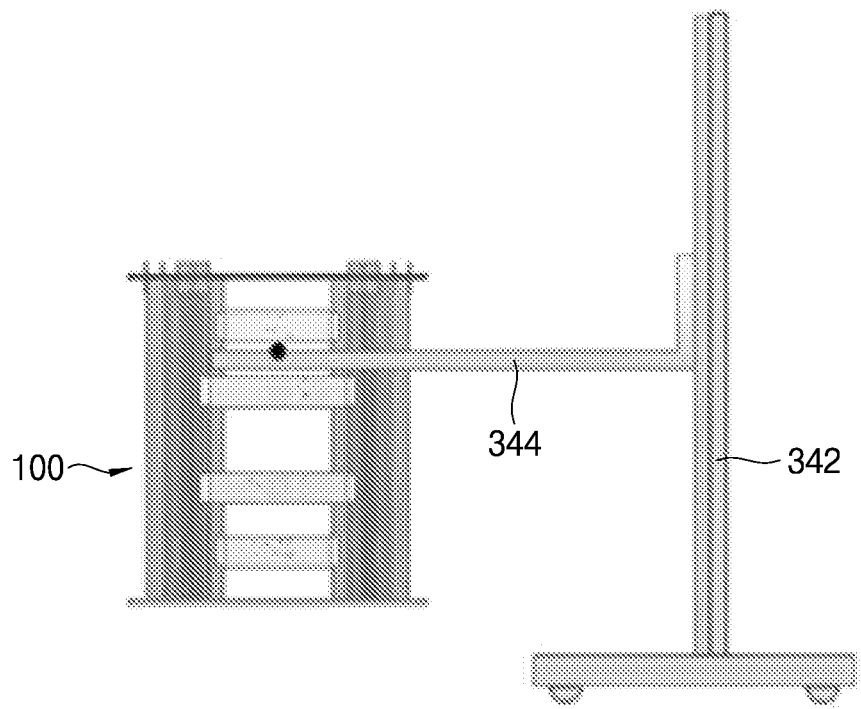

Referring to FIG. 29, in an embodiment, the crane 100 is coupled to a stacker 342 using a jig 344.

Figure 30:
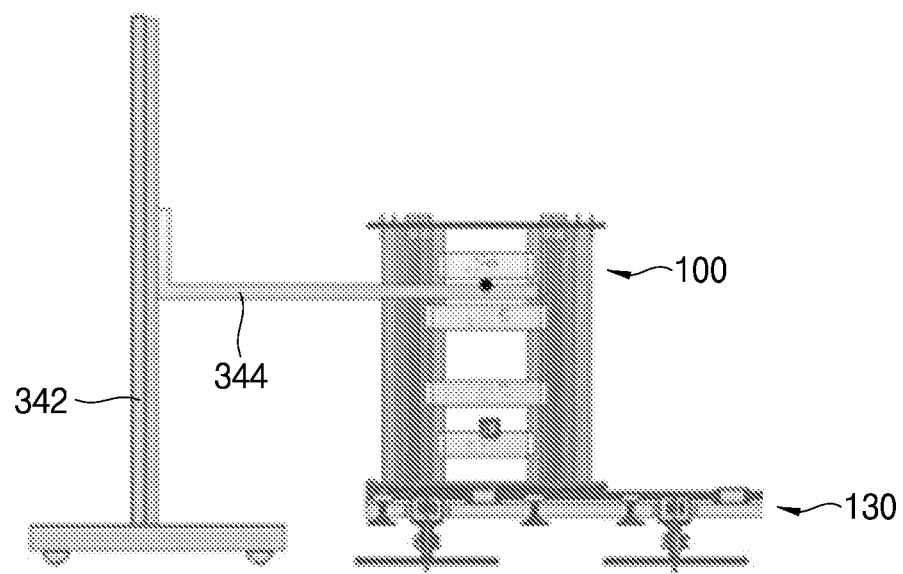

Referring to FIG. 30, in an embodiment, the stacker 342 places the crane 100 on a crane base 130 using the jig 344. The crane 100 is disposed on and coupled to the crane base 130. For example, the lower plate 11 is disposed on and fixed to the crane base 130. When the lower plate 11 is omitted, each of lower profiles 21, 22, 23 and 24 is fixed to a designated position on the crane base 130.

Figure 31:
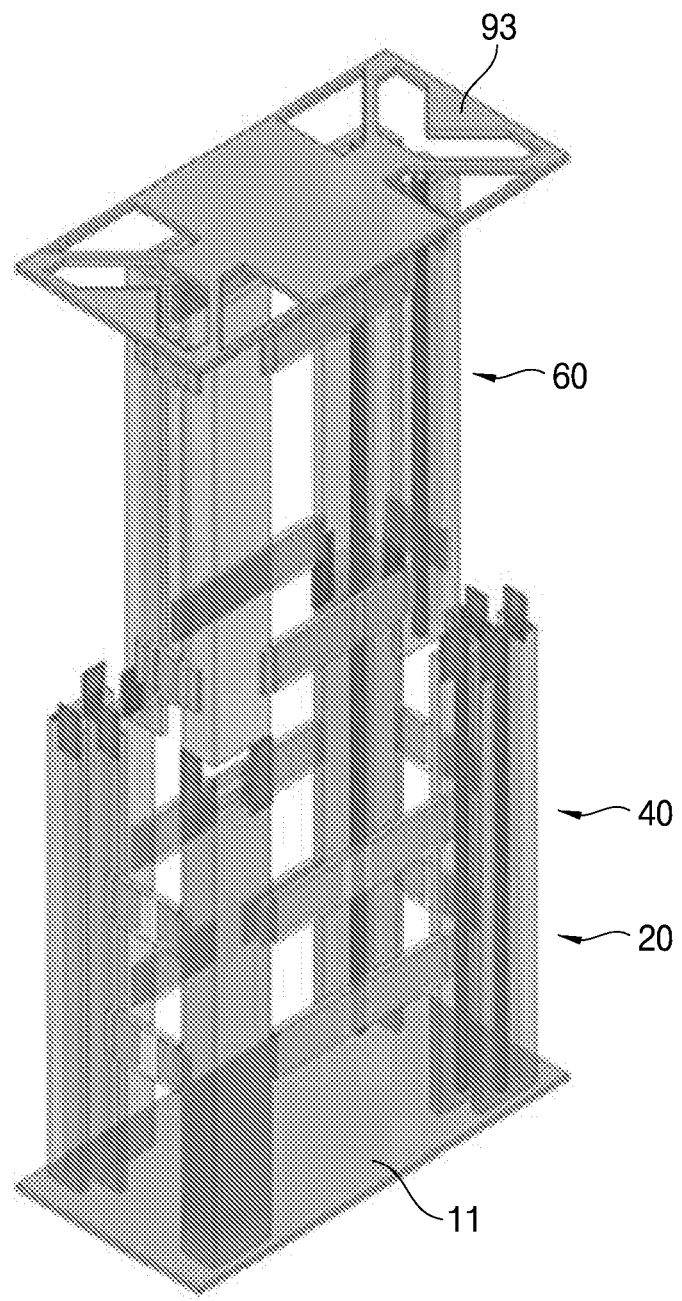

Referring to FIG. 31, in an embodiment, the stacker 342 lifts the upper plate 93 and the upper module 60 using the jig 344. While lifting the upper module 60, the plurality of upper guide blocks 74 are confined by the plurality of middle elevation guides 47.

Figure 32:
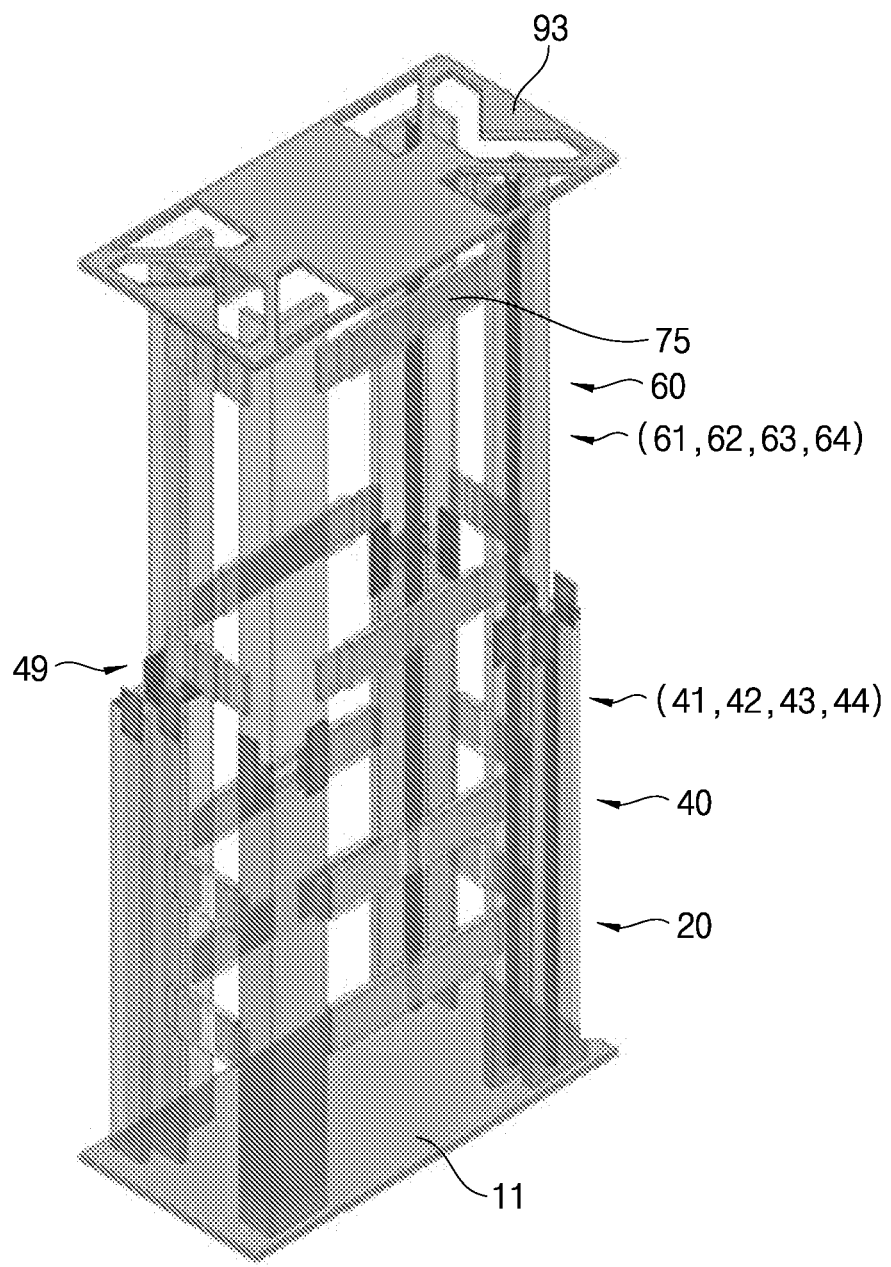

Referring to FIG. 32, in an embodiment, when a plurality of upper profiles 61, 62, 63 and 64 is lifted to a higher level than a plurality of middle profiles 41, 42, 43 and 44, the plurality of upper guide blocks 74 are released from confinement by the plurality of middle elevation guides 47. A plurality of upper expandable plates 75 are expanded in a horizontal direction. The plurality of upper profiles 61, 62, 63 and 64 are moved in accordance with expansion of the plurality of upper expandable plates 75. The plurality of cam guides 94 limit a movement path of the plurality of upper cam followers 71. A movement path of the plurality of upper profiles 61, 62, 63 and 64 is limited by the plurality of earn guides 94. The plurality of middle stoppers 49 stop movement of the plurality of upper profiles 61, 62, 63 and 64. A plurality of positioning holes 52 (see FIG. 7) of the plurality of upper profiles 61, 62, 63 and 64 are respectively coupled to a plurality of middle positioning pins 51. Each of the plurality of upper profiles 61, 62, 63 and 64 is disposed over and vertically aligned with a corresponding middle profile 41, 42, 43 and 44.

The plurality of middle stoppers 49 contact the outsides of the plurality of middle profiles 41, 42, 43 and 44 and the plurality of upper profiles 61, 62, 63 and 64. The plurality of middle stoppers 49 are fixed to the outsides of the plurality of middle profiles 41, 42, 43 and 44 and the plurality of upper profiles 61, 62, 63 and 64 using various methods, such as bolting (bolt/nut), riveting, welding, clamping, or a combination thereof. Each of the plurality of elevation guides 67 are disposed over and vertically aligned with a corresponding middle elevation guide 47.

Figure 33:
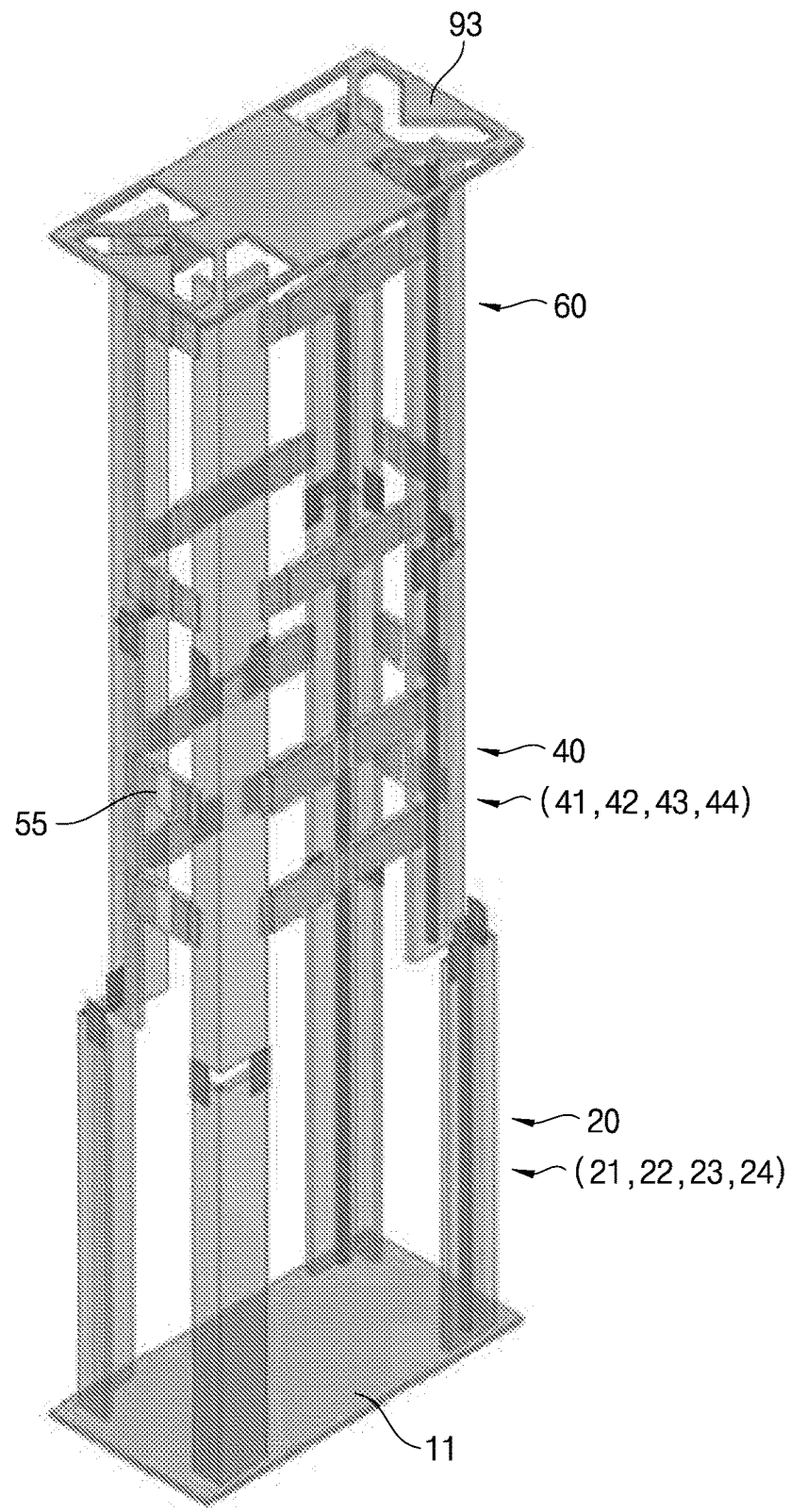

Referring to FIG. 33, in an embodiment, the stacker 342 lifts the upper plate 93, the upper module 60, and the middle module 40 using the jig 344. While lifting the middle module 40, the plurality of middle guide blocks 54 are confined by the plurality of lower elevation guides 27.

Figure 34:
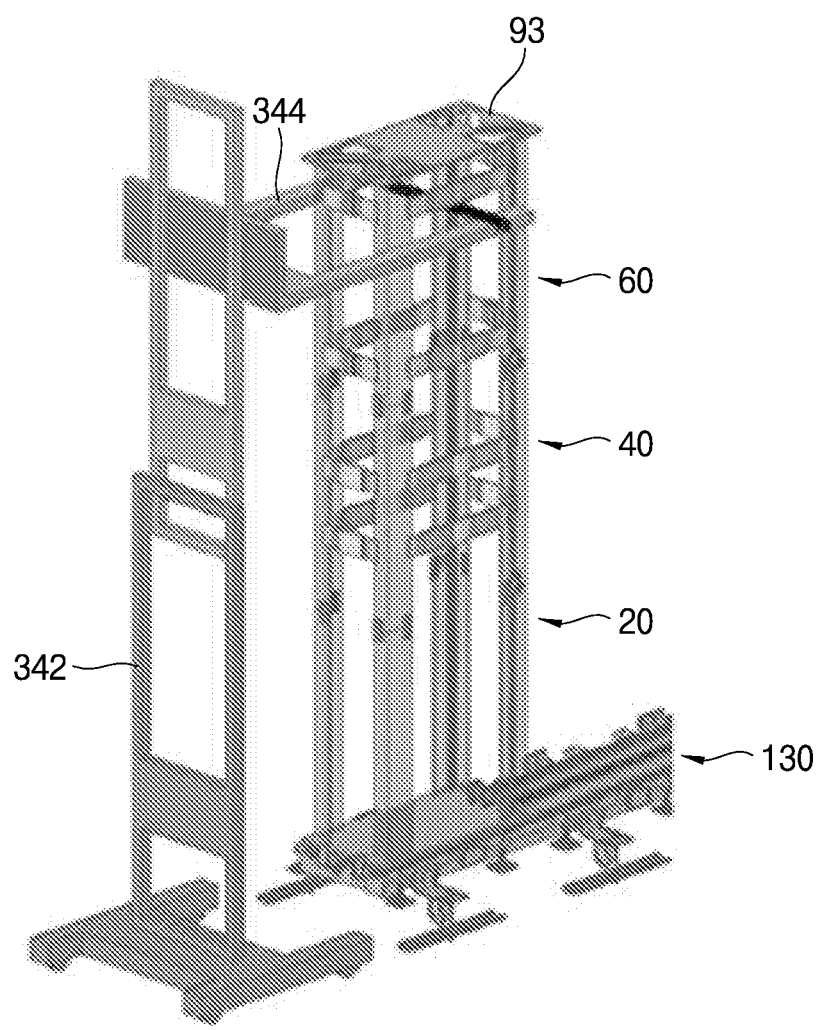

Referring to FIG. 34, in an embodiment, when the plurality of middle profiles 41, 42, 43 and 44 are raised to a higher level than the plurality of lower profiles 21, 22, 23 and 24, the plurality of middle guide blocks 54 are released from confinement by the plurality of lower elevation guides 27. The plurality of middle expandable plates 55 and the plurality of upper expandable plates 75 are expanded in a horizontal direction. The plurality of middle profiles 41, 42, 43 and 44 and the plurality of upper profiles 61, 62, 63 and 64 are moved in accordance with the expansion of the plurality of middle expandable plates 55 and the plurality of upper expandable plates 75. The plurality of cam guides 94 limit a movement path of the plurality of upper cam followers 71. Movement paths of the plurality of middle profiles 41, 42, 43 and 44 and the plurality of upper profiles 61, 62, 63 and 64 are limited by the plurality of cam guides 94.

The plurality of lower stoppers 29 stop movement of the plurality of middle profiles 41, 42, 43 and 44. The plurality of positioning holes 52 (see FIG. 7) of the plurality of middle profiles 41, 42, 43 and 44 are coupled to the plurality of lower positioning pins 31. Each of the plurality of middle profiles 41, 42, 43 and 44 is disposed over and vertically aligned with a corresponding lower profile 21, 22, 23 and 24.

The plurality of lower stoppers 29 contact an outside of the plurality of lower profiles 21, 22, 23 and 24 and the outside of the plurality of middle profiles 41, 42, 43 and 44. The plurality of lower stoppers 29 are fixed to the outsides of the plurality of lower profiles 21, 22, 23 and 24 and the plurality of middle profiles 41, 42, 43 and 44 using various methods, such as bolting (bolt/nut), riveting, welding, clamping, or a combination thereof. Each of the plurality of middle elevation guides 47 is disposed over and vertically aligned with a corresponding lower elevation guide 27.

The stacker 342 and the jig 344 are removed.

In accordance with the exemplary embodiments of the disclosure, a stocker system that includes a crane adjacent to a main frame is provided. The crane includes a lower module, a middle module, and an upper module. The middle module and the upper module include a plurality of middle expandable plates and a plurality of upper expandable plates. A crane is provided that can reduce an installation time and prevent safety incidents, a stocker system is provided that includes the same, and an installation method thereof is provided.

While the embodiments of the disclosure have been described with reference to the accompanying drawings, it should be understood by those skilled in the art that various modifications may be made without departing from the scope of embodiments of the disclosure. Therefore, above-described embodiments should be considered in a descriptive sense only and not for purposes of limitation.

What is claimed is:

1. A stocker system, comprising:
a main frame;
a plurality of shelves disposed within the main frame; and
a crane adjacent to the main frame,
wherein the crane comprises
a lower module that includes a plurality of lower profiles, and
an upper module disposed on the lower module, and
wherein the upper module comprises:
a plurality of upper profiles disposed on the plurality of lower profiles in a first direction, and
at least one upper expandable plate disposed between the plurality of upper profiles in a second direction and expandable between the plurality of upper profiles in the second direction,
wherein the first direction and the second direction are different.

2. The stocker system according to claim 1, wherein the at least one upper expandable plate comprises a plurality of elastic members.

3. The stocker system according to claim 1, wherein:
the lower module further comprises a plurality of lower stoppers in contact with outside surfaces of the plurality of lower profiles; and
each of the plurality of lower stoppers protrudes above a level of top surfaces of the plurality of lower profiles.

4. The stocker system according to claim 1, wherein:
the lower module further comprises a plurality of lower positioning pins disposed on upper corners of the plurality of lower profiles; and
the upper module further comprises a plurality of positioning holes disposed in lower corners of the plurality of upper profiles.

5. The stocker system according to claim 1, further comprising:
an upper plate disposed on the upper module, wherein the upper plate includes a plurality of cam guides,
wherein the upper module further comprises a plurality of upper cam followers disposed on upper corners of the plurality of upper profiles and coupled to the plurality of cam guides.

6. The stocker system according to claim 1, further comprising:
a task robot disposed within the crane; and
an automatic port and a manual port disposed at one side of the main frame.

7. A crane, comprising:
a lower module that includes a plurality of lower profiles spaced apart from each other; and
an upper module disposed on the lower module,
wherein the upper module comprises:
a plurality of upper profiles disposed on the plurality of lower profiles in a first direction, and
at least one upper expandable plate disposed between the plurality of upper profiles in a second direction and expandable between the plurality of upper profiles in the second direction,
wherein the first direction and the second direction are different.

8. The crane according to claim 7, further comprising:
a middle module disposed between the lower module and the upper module,
wherein the middle module comprises:
a plurality of middle profiles disposed on the plurality of lower profiles, and
at least one middle expandable plate disposed between the plurality of middle profiles.

9. The crane according to claim 8, wherein:
the middle module further comprises a plurality of middle stoppers in contact with outside surfaces of the plurality of middle profiles; and
each of the plurality of middle stoppers protrudes above a level of top surfaces of the plurality of middle profiles.

10. The crane according to claim 8, wherein the middle module further comprises a middle support disposed between the plurality of middle profiles.

11. The crane according to claim 7, wherein the at least one upper expandable plate comprises a plurality of elastic members.

12. The crane according to claim 11, wherein:
the at least one upper expandable plate comprises:
a first plate in contact with a corresponding upper profile,
a second plate in contact with another corresponding upper profile, and
a third plate that connects the first plate and the second plate, wherein the plurality of elastic members are connected between the first plate and the third plate and between the second plate and the third plate.

13. The crane according to claim 7, wherein:
the lower module further comprises a plurality of lower stoppers in contact with outside surfaces of the plurality of lower profiles; and
each of the plurality of lower stoppers protrudes above a level of top surfaces of the plurality of lower profiles.

14. The crane according to claim 7, wherein:
the lower module further comprises a plurality of lower positioning pins disposed on upper corners of the plurality of lower profiles: and
the upper module further comprises a plural of positioning holes disposed in lower corners of the plurality of upper profiles.

15. The, crane-according to claim 7, further comprising:
an upper plate disposed on the upper module, wherein the upper plate includes a plurality of cam guides,
wherein the upper module further comprises a plurality of upper cam followers disposed on upper corners of the plurality of upper profiles and coupled to the plurality of cam guides.

16. The crane according to claim 7, wherein the lower module further comprises a lower expandable plate, a lower support or a combination thereof disposed between the plurality of lower profiles.

17. The crane according to claim 7, wherein the upper module further comprises an upper support disposed between the plurality of upper profiles.

18. A crane, comprising:
a lower plate;
a lower module disposed on the lower plate, wherein the lower module includes a plurality of lower profiles spaced apart from one another;
a middle module disposed on the lower module;
an upper module disposed on the middle module; and
an upper plate disposed on the upper module,
wherein the middle module comprises
a plurality of middle profiles disposed on the plurality of lower profiles in a first direction, and
at least one middle expandable plate disposed between the plurality of middle profiles in a second direction and expandable between the plurality of middle profiles in the second direction, and
wherein the upper module comprises:
a plurality of upper profiles disposed on the plurality of middle profiles in the first direction, and
at least one upper expandable plate disposed between the plurality of upper profiles in the second direction and expandable between the plurality of upper profiles in the second direction,
wherein the first direction and the second direction are different.

19. The crane according to claim 18, wherein each of the at least one middle expandable plate and the at least one upper expandable plate comprises a plurality of elastic members.

20. The crane according to claim 18, wherein:
the lower module further comprises a plurality of lower stoppers in contact with outside surfaces of the plurality of lower profiles;
the middle module further comprises a plurality of middle stoppers in contact with outside surfaces of the plurality of middle profiles;
each of the plurality of lower stoppers protrudes above a level of top surfaces of the plurality of lower profiles;
each of the plurality of lower stoppers contacts an outside surface of the plurality of middle profiles;
each of the plurality of middle stoppers protrudes above a level of top surfaces of the plurality of middle profiles; and
each of the plurality of middle stoppers contacts an outside surface of the plurality of upper profiles.

* * * * *